United States Patent
Ishikawa et al.

[11] Patent Number: 6,046,501
[45] Date of Patent: Apr. 4, 2000

[54] RF-DRIVEN SEMICONDUCTOR DEVICE

[75] Inventors: Osamu Ishikawa, Kyoto; Takahiro Yokoyama, Hyogo; Taketo Kunihisa, Osaka; Masaaki Nishijima, Osaka; Shinji Yamamoto, Osaka; Junji Itoh, Osaka; Toshio Fujiwara; Kaoru Muramatsu, both of Okayama, all of Japan

[73] Assignee: Matsushita Electric Industrial Co., Ltd., Osaka, Japan

[21] Appl. No.: 08/942,443

[22] Filed: Oct. 1, 1997

[30] Foreign Application Priority Data

| Oct. 2, 1996 | [JP] | Japan | 8-261615 |
| Dec. 10, 1996 | [JP] | Japan | 8-329346 |

[51] Int. Cl.⁷ ............... H01L 23/04; H01L 23/34
[52] U.S. Cl. .................. 257/730; 257/728; 333/247
[58] Field of Search ................ 257/676, 728, 257/730, 667, 782, 796, 684; 333/247

[56] References Cited

U.S. PATENT DOCUMENTS

| 4,706,105 | 11/1987 | Masuda et al. | 257/730 |
| 4,994,897 | 2/1991 | Golubic et al. | 257/667 |
| 5,278,446 | 1/1994 | Nagaraj et al. | 257/707 |
| 5,445,995 | 8/1995 | Casati et al. | 437/211 |

FOREIGN PATENT DOCUMENTS

| 0 408 904 | 1/1991 | European Pat. Off. . |
| 0 548 496 | 6/1993 | European Pat. Off. . |
| 0 712 160 | 5/1996 | European Pat. Off. . |
| 63-284890 | 11/1988 | Japan . |
| 2-148859 | 6/1990 | Japan . |

OTHER PUBLICATIONS

T. Kawai, Mobile Communication Device Using MMIC Technology:, SPECIAL: Semiconductor in Fujitsu, vo. 47, No. 5, pp. 398–402, Sep. 1996, together with a partial English translation thereof.

*Primary Examiner*—Teresa M. Arroyo
*Attorney, Agent, or Firm*—McDermott, Will & Emery

[57] ABSTRACT

An RF-driven semiconductor chip is die-bonded to the top face of a metal plate. The semiconductor chip and the metal plate are molded together with outer leads in a plastic package in the form of a rectangular parallelepiped. The metal plate is exposed at the back face of the plastic package. The metal plate is not protruding from the front and rear side faces of the plastic package. The front and rear side faces of the metal plate are flush with the front and rear side faces of the plastic package and partially exposed at the front and rear side faces of the plastic package. The front and rear portions of the plastic package are centrally formed with respective cutaway portions each in the form of a rectangular parallelepiped. The top face of the metal plate is exposed in the cutaway portions formed centrally in the front and rear portions of the plastic package to form solder portions.

3 Claims, 20 Drawing Sheets

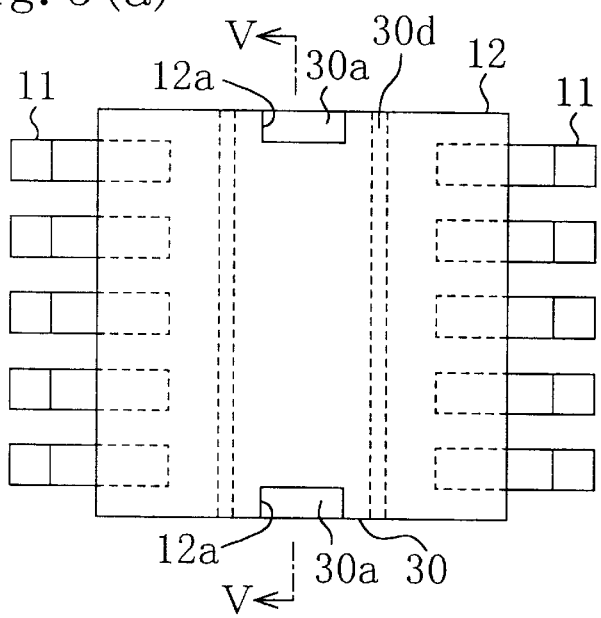
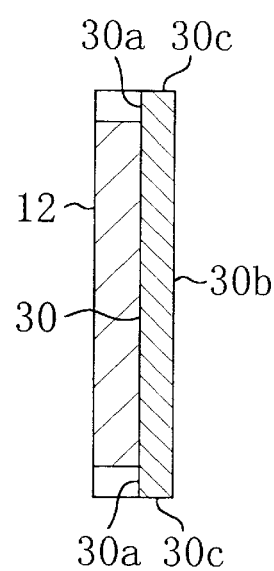
Fig. 5(a)
Fig. 5(b)
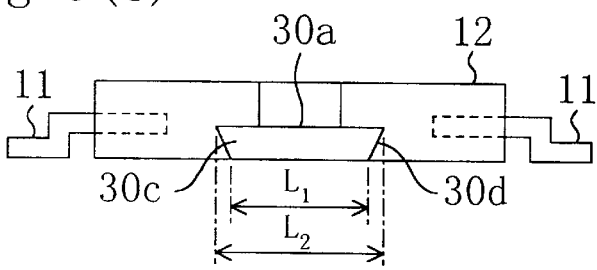
Fig. 5(c)
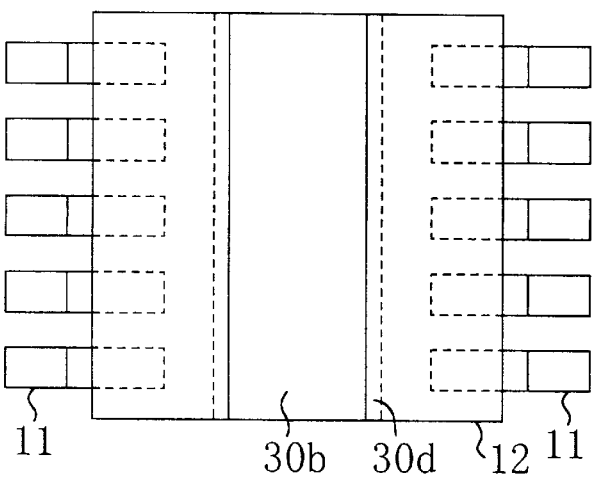
Fig. 5(d)

Fig. 19(a)
Prior Art
Fig. 19(b)
Prior Art
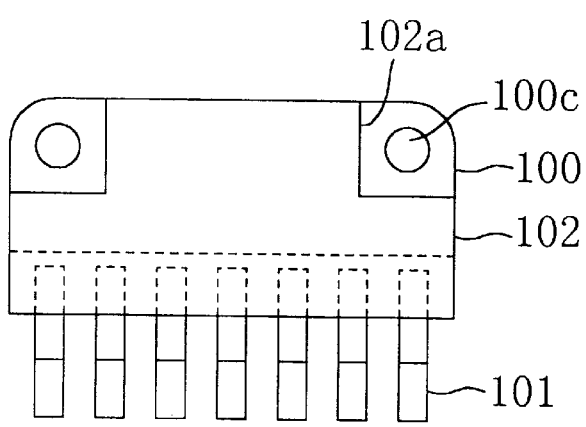
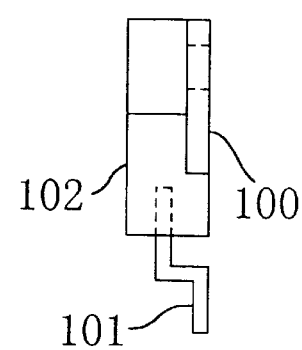

RF-DRIVEN SEMICONDUCTOR DEVICE

BACKGROUND OF THE INVENTION

The present invention relates to RF-driven semiconductor devices and, more particularly, to an RF-driven semiconductor device comprising an RF-driven semiconductor chip, a metal plate having the semiconductor chip die-bonded thereto, and outer leads electrically connected to the signal electrode of the semiconductor chip via bonding wires, all of which are packaged with a mold resin.

At present, an RF-driven semiconductor device wherein a semiconductor chip, a metal plate having the semiconductor chip die-bonded thereto, and outer leads electrically connected to the signal electrode of the semiconductor chip are molded in a resin is the most prevalent because of its cost efficiency and excellent manufacturability.

Conventionally, the RF-driven semiconductor device composed of a plastic mold package has been used in such a device as a television set, a video recorder, or a personal computer which operates at a frequency, at most, of 200 MHz or less.

However, since RF power ranging in frequency from 1 to 2 GHz has been used in terminal equipment for recent mobile communication, provisions should be made for high frequencies in an RF-driven semiconductor device to be mounted on such terminal equipment. The difference in operating frequency between several hundreds of megahertz and several gigahertz exerts two major influences upon the RF-driven semiconductor device: increased inductance that should be reduced by providing a minimum path for the ground potential and a drastic change in impedance caused by increased capacitance and inductance due to the outer leads protruding outwardly from the plastic package.

Because miniaturization and weight reduction are required of the terminal equipment for mobile communication which employs RF power, miniaturization and weight reduction are also required of the RF-driven semiconductor device to be mounted on the terminal equipment. In addition, higher integration of functions is required of the RF-driven semiconductor device.

Higher integration of functions may be achieved by a first method wherein increasing miniaturization is pursued as in recent silicon LSIs or by a second method wherein a plurality of semiconductor chips having different functions and manufactured by different processes are molded in a single plastic package for the achievement of a higher packaging efficiency than is achievable in the case of molding the semiconductor chips in individual plastic packages.

In accordance with the second method, higher integration of functions and further miniaturization are achieved in the terminal equipment for mobile communication than in the case where a plurality of semiconductor chips are molded in individual plastic packages. By thus molding the plurality of semiconductor chips in the single plastic package, the plurality of semiconductor chip manufactured by different processes are enabled to function as a single RF-driven semiconductor device. For example, there has been proposed the technology for molding, in a single package, a modulator IC formed on a silicon substrate and a MOSFET for amplifying RF power formed on a compound semiconductor, each used in the terminal equipment for mobile communication.

Referring now to FIGS. 17(a) to 17(d), a semiconductor device according to a first conventional embodiment will be described. FIGS. 17(a) to 17(d) show the semiconductor device having an RF-driven semiconductor chip, of which FIG. 17(a) is a plan view, FIG. 17(b) is a cross-sectional view taken along the line XVII—XVII of FIG. 17(a), FIG. 17(c) is a front view, and FIG. 17(d) is a bottom view.

As shown in the drawings, the RF-driven semiconductor chip (not shown) is die-bonded to the top face of a metal plate 100 separated from a lead frame. The metal plate 100 and the semiconductor chip are molded together with outer leads 101 for connection with an external electrode, which are also separated from the lead frame, in a plastic package 102 in the form of a flat rectangular parallelepiped. The signal electrode of the semiconductor chip is electrically connected to the outer leads 101 via bonding wires or the like, though the drawing thereof is omitted here. In this case, the outer leads 101 are protruding outwardly from the pair of opposed side faces of the plastic package 102. On the other hand, the metal plate 100 are protruding from the front and rear side faces of the plastic package 102, while having projections 100a bending over to the back face of the plastic package 102. The projections 100a of the metal plate 100 are connected to the ground pattern of a printed circuit board (not shown) for grounding. Countermeasures have thus been taken against increased inductance in the semiconductor device according to the first conventional embodiment.

Referring next to FIGS. 18(a) to 18(d), a semiconductor device according to a second conventional embodiment will be described. FIGS. 18(a) to 18(d) show the semiconductor device having an RF-driven semiconductor chip, of which FIG. 18(a) is a plan view, FIG. 18(b) is a side view, FIG. 18(c) is a front view, and FIG. 18(d) is a bottom view. In the second conventional embodiment, the description of the same components as used in the first conventional embodiment will be omitted by providing the same reference numerals. The second conventional embodiment is different from the first conventional embodiment in that the metal plate 100 has the front, rear, right, and left side faces thoroughly covered with a plastic package 102, except for the center of the back face thereof, which is uncovered with the plastic package 102 to be connected by soldering to the ground pattern of the printed circuit board. Thus, countermeasures have also been taken against higher inductance in the semiconductor device according to the second conventional embodiment.

Referring next to FIGS. 19(a) and 19(b), a semiconductor device according to a third conventional embodiment will be described. FIGS. 19(a) and 19(b) show the semiconductor device having a semiconductor chip driven with low-frequency power, of which FIG. 19(a) is a plan view and FIG. 19(b) is a side view. Since the semiconductor device according to the third conventional embodiment is driven with low-frequency power, it falls into a technical category different from the technical category into which the RF-driven semiconductor device according to the present invention falls. However, the description will be given to the semiconductor device according to the third conventional embodiment because of some common components used in both of the semiconductor devices.

As shown in the drawings, the semiconductor chip (not shown) is die-bonded to the top face of a metal plate 100 separated from a lead frame. The metal plate 100 and the semiconductor chip are molded in a plastic package 102 together with outer leads 101 for connection with an external electrode, which are also separated from the lead frame. The signal electrode of the semiconductor chip is electrically connected to the outer leads 101 via bonding wires or the like, though the drawing thereof is omitted here. The third conventional embodiment is characterized in that the outer leads 101 are protruding only from the front side face of the plastic package 102. The both edge portions of the rear side face of the plastic package 102 are partially cut away so that the metal plate 100 is exposed at the top surface through the cutaway portions 102a. The exposed portions of the metal plate 100 are formed with respective holes 100c. The metal plate 100 and hence the semiconductor device according to the third conventional embodiment are fastened to the printed circuit board with screws inserted into the holes 100c.

Referring next to FIGS. 20(a) and 20(b), a semiconductor device according to a fourth conventional embodiment will be described. FIGS. 20(a) and 20(b) show the semiconductor device having a plurality of, e.g., two RF-driven semiconductor chips, of which FIG. 20(a) is a plan view and FIG. 20(b) is a cross-sectional view taken along the line XX—XX of FIG. 20(a).

As shown in the drawings, first and second RF-driven semiconductor chips 105 and 106 are die-bonded to the top face of a metal plate 100 separated from a lead frame. The metal plate 100 and the first and second semiconductor chips 105 and 106 are molded together with outer leads 101 for connection with an external electrode, which are also separated from the lead frame, in a plastic package 102 in the form of a flat rectangular parallelepiped. The respective signal electrodes of the first and second semiconductor chips 105 and 106 are electrically connected to the outer leads 101 via bonding wires or the like, though the drawing thereof is omitted here. In this case, the outer leads 101 are protruding outwardly from the front and rear side faces of the plastic package 102. On the other hand, the metal plate 100 is protruding from the right and left side faces of the plastic package 102. The first and second semiconductor chips 105 and 106 are die-bonded to the top face of the metal plate 100, while projections 100a of the metal plate 100 are connected to the ground pattern of a printed circuit board (not shown) for grounding. Thus, countermeasures have also been taken against higher inductance and provisions have been made for the achievement of higher integration of functions in the package for RF semiconductor according to the fourth conventional embodiment.

In the semiconductor device according to the first conventional embodiment shown in FIGS. 17(a) to 17(d), grounding for RF power has been achieved by the projections 100a of the metal plate 100 protruding from the plastic package 102 and bending over to the back face thereof, while the package has not been miniaturized satisfactorily. Since each of the projections 100a is normally required to have a length of about 1 mm, the projections 100a on both sides increase the size of the package by about 2 mm in total. If the metal plate 100 is provided with the projections having the total length of 2 mm, the length of the plastic package 102 having an original length of about 5 to 6 mm will be increased substantially by about 40%. The scaling up of the semiconductor device is incompatible with the trends toward further miniaturized terminal equipment for mobile communication. Hence, the implementation of an IC having maximum functions and occupying a minimum area has been demanded strongly for miniaturized terminal equipment.

In the semiconductor device according to the second conventional embodiment shown in FIGS. 18(a) to 18(d), grounding for RF power has been achieved by the metal plate 100 exposed at the center of the back face of the plastic package 102 and the substantial increase in the length of the plastic package 102 can be avoided. However, since the metal plate 100 is soldered to the printed circuit board only at the center of the back face thereof, it is difficult to verify from the outside that the metal plate 100 is soldered after the mounting of the semiconductor device onto the printed circuit board. As a result, the process may proceed to the subsequent step with the metal plate 100 deficiently soldered to the printed circuit board, which leads to a rejection in the final conduction test on account of faulty operation. Thus, although the plastic package 102 can be miniaturized in the second conventional embodiment, the yield of the device is lowered disadvantageously.

In the semiconductor device according to the third conventional embodiment shown in FIGS. 19(a) and 19(b), the outer leads 101 are protruding from the front side face of the plastic package 102 and the metal plate 100 is fastened to the printed circuit board at the both edge portions of the rear side face thereof with small screws. Therefore, the third conventional embodiment is not applicable to a semiconductor device in which a larger number of outer leads are protruding from a small-sized plastic package such as the RF-driven semiconductor device for use in the terminal equipment for mobile communication.

The semiconductor device according to the fourth conventional embodiment shown in FIGS. 20(a) and 20(b) has the following problem. In die-bonding the first and second semiconductor chips 105 and 106 to the metal plate 100, the semiconductor chips are pressed against the metal plate 100 with a bonding material such as a gold-silicon alloy, gold-lead alloy, or silver paste attached to the back faces of the semiconductor chips and the bonding material attached to that one of the first and second semiconductor chips 105 and 106 die-bonded earlier is pushed out of the back side of the semiconductor chip and spreads extensively on the top face of the metal plate 100. The bonding material on the metal plate 100 further spreads out to the region to which the other of the first and second semiconductor chips 105 and 106 is to be die-bonded later. This prevents the semiconductor chip die-bonded later from being placed in parallel with the top surface of the metal plate 100, resulting in unsatisfactory wire bonding between the signal electrode of the semiconductor chip and the outer leads. Although the foregoing problem may be solved by increasing the spacing w between the first and semiconductor chips 105 and 106, the size of the plastic package 102 is also increased disadvantageously. Specifically, it is necessary to adjust the spacing w between the first and second semiconductor chips 105 and 106 to be equal to or more than 0.6 mm in order to prevent the bonding material applied to the semiconductor chip die-bonded earlier from spreading out to the region to which the other semiconductor chip is to be die-bonded later. However, a spacing of 0.6 mm or more may not be provided between the first and second semiconductor chips 105 and 106 in the RF-driven semiconductor device in which a plurality of semiconductor chips are die-bonded to a single metal plate for the miniaturization of the plastic package 102.

As described above, the semiconductor devices according to the first, third, and fourth conventional embodiments are disadvantageous in terms of miniaturizing the plastic packages, while the semiconductor device according to the second conventional embodiment is disadvantageous in terms of reliability and yield.

SUMMARY OF THE INVENTION

It is therefore an object of the present invention to miniaturize a plastic package for an RF-driven semiconductor device and improve the reliability and yield of the semiconductor device.

A first RF-driven semiconductor device according to the present invention is mounted on a printed circuit board having a ground pattern and comprises: an RF-driven semiconductor chip; a metal plate having the semiconductor chip die-bonded to a top face thereof; a plastic package in the shape of a rectangular parallelepiped having the semiconductor chip and the metal plate molded therein, the metal plate having an exposed back face and not protruding from the periphery of the plastic package; outer leads protruding outwardly from a side face of the plastic package and electrically connected to a signal electrode of the semiconductor chip; and a solder portion composed of an edge portion of the top face of the metal plate exposed through a cutaway portion formed in an edge portion of the plastic package, the solder portion being soldered to the ground pattern of the printed circuit board.

Since the first RF-driven semiconductor device comprises the solder portions composed of the top face of the metal plate exposed through the cutaway portions formed in the edge portions of the plastic package, the solder portions can reliably be bonded to the ground pattern of the printed circuit board, while the solder can be inspected from above by visual inspection or by means of a television camera. Consequently, the metal plate can reliably be bonded by soldering to the printed circuit board without protruding from the plastic package, which implements a miniaturized plastic package as well as a device with improved reliability and yield.

In the first RF-driven semiconductor device, if the outer leads are protruding outwardly from a pair of opposed side faces of the plastic package, there can be implemented a miniaturized RF-driven semiconductor device having the outer leads protruding from the pair of opposed side faces.

In the RF-driven semiconductor device having the outer leads protruding from the pair of opposed side faces, the solder portions are preferably composed of a pair of opposed edge portions of the top face of the metal plate, the pair of opposed edge portions being uncovered with the plastic package and corresponding to the other pair of opposed side faces of the plastic package unprovided with the outer leads.

In the arrangement, the metal plate is soldered to the ground pattern of the printed circuit board at the other pair of opposed side faces thereof, which further ensures bonding of the RF-driven semiconductor device to the printed circuit board.

In the RF-driven semiconductor device having the outer leads protruding from the pair of opposed side faces, the metal plate preferably has an exposed portion uncovered with the plastic package at the back face thereof, the exposed portion extending continuously between a pair of opposed side faces of the metal plate corresponding to the pair of opposed side faces of the plastic package unprovided with the outer leads, the exposed portion and the solder portions each uncovered with the plastic package being contiguous to each other via the pair of opposed side faces of the metal plate.

In the arrangement, the metal plate is reliably bonded to the ground pattern of the printed circuit board at the solder portions, side faces, and entire exposed portion thereof, which further ensures the bonding of the RF-driven semiconductor device to the printed circuit board.

In this case, the RF-driven semiconductor device preferably further comprises a covering member composed of a material having an excellent affinity for a solder material, the covering member covering the exposed portion of the metal plate uncovered with the plastic package. The arrangement ensures the spreading of the solder material in the wet state over the solder portions, side faces, and exposed portion of the metal plate and thereby increases the strength of bonding between the metal plate and the ground pattern.

The RF-driven semiconductor device having the outer leads protruding from the pair of side faces preferably further comprises respective detachment preventing elements provided on a pair of opposed side faces of the metal plate corresponding to the pair of opposed side faces of the plastic package provided with the outer leads, the detachment preventing elements preventing the metal plate from being detached from the plastic package.

The arrangement prevents the metal plate from being detached from the plastic package even when a large tractive force or an external pressure is applied to the metal plate.

In this case, the detachment preventing elements are preferably composed of bending portions bending inside the plastic package. In the arrangement, the bending portion is engaged with the plastic package when a tractive force or an external pressure is applied to the metal plate, so that the metal plate is surely prevented from being detached from the plastic package.

In this case, the detachment preventing elements formed on the side faces of the metal plate are preferably composed of sloped faces downwardly tapered in cross section toward the back face of the metal plate. In the arrangement, the sloped faces downwardly tapered in cross section are engaged with the plastic package when a tractive force or an external pressure is applied to the metal plate, so that the metal plate is surely prevented from being detached from the plastic package.

In the first RF-driven semiconductor device, outer leads are preferably protruding outwardly from the four side faces of the plastic package and the solder portion is preferably provided on at least one corner of the top face of the metal plate. The arrangement implements a miniaturized RF-driven semiconductor device having the outer leads protruding from the four side faces thereof.

In the first RF-driven semiconductor device, the outer leads are preferably protruding outwardly from the four side faces of the plastic package and the solder portion is preferably provided on each of the four corners of the top face of the metal plate. In the arrangement, the metal plate is soldered to the ground pattern of the printed circuit board at the four corners thereof, which further ensures the bonding of the RF-driven semiconductor device to the printed circuit board.

A second RF-driven semiconductor device according to the present invention comprises: an RF-driven semiconductor chip; a metal plate having the semiconductor chip die-bonded thereto via a bonding material supplied to a back face of the semiconductor chip; a plastic package having the semiconductor chip and the metal plate molded therein; outer leads protruding outwardly from a side face of the plastic package and electrically connected to a signal electrode of the semiconductor chip; and a recessed portion formed in the periphery of a region of the metal plate to which the semiconductor chip is to be die-bonded, the recessed portion accommodating the bonding material pushed out of the back side of the semiconductor chip.

In the second RF-driven semiconductor device, the metal plate is provided with the recessed portion formed in the area surrounding the region to which the semiconductor chip is to be die-bonded such that the bonding material pushed out of the back side of the semiconductor chip is accommodated in the recessed portion. Accordingly, even when the bonding material is supplied in an amount sufficient to be pushed out of the back side of the semiconductor chip, it is accommodated in the recessed portion and less likely to spread out of the die-bonding region. Hence, it is unnecessary to provide a marginal region around the die-bonding region of the metal plate, which implements a miniaturized plastic package and a miniaturized RF-driven semiconductor device.

A third RF-driven semiconductor device according to the present invention comprises: an RF-driven semiconductor chip a metal plate having the semiconductor chip die-bonded thereto via a bonding material supplied to a back face of the semiconductor chip; a plastic package having the semiconductor chip and the metal plate molded therein; outer leads protruding outwardly from a side face of the plastic package and electrically connected to a signal electrode of the semiconductor chip; and a projecting portion formed on the periphery of a region of the metal plate to which the semiconductor chip is to be die-bonded, the projecting portion preventing the bonding material pushed out of the back side of the semiconductor chip from flowing.

In the third embodiment, the metal plate is provided with a projecting portion formed in the area surrounding the region to which the semiconductor chip is to be die-bonded such that the bonding material pushed out of the back side of the semiconductor chip is prevented from flowing. Accordingly, even when the bonding material is supplied in an amount sufficient to be pushed out of the back side of the semiconductor chip, it is prevented by the projecting portion from flowing and spreading out of the die-bonding region. Hence, it is unnecessary to provide a marginal region around the die-bonding region of the metal plate, which implements a miniaturized plastic package and a miniaturized RF-driven semiconductor device.

A fourth RF-driven semiconductor device according to the present invention comprises: an RF-driven semiconductor chip a metal plate having the semiconductor chip die-bonded thereto via a bonding material supplied to a back face of the semiconductor chip; a plastic package having the semiconductor chip and the metal plate molded therein; outer leads protruding outwardly from a side face of the plastic package and electrically connected to a signal electrode of the semiconductor chip; and a recessed portion formed in the metal plate, the recessed portion having a plan configuration slightly larger in size than a plan configuration of the semiconductor chip, the semiconductor chip being die-bonded to a bottom face of the recessed portion formed in the metal plate.

In the fourth RF-driven semiconductor device, the metal plate is formed with the recessed portion having the plan configuration slightly larger in size than the plan configuration of the semiconductor chip such that the semiconductor chip is die-bonded to the bottom face of the recessed portion formed in the metal plate. Accordingly, even when the bonding material is supplied in an amount sufficient to be pushed out of the back side of the semiconductor chip, it is prevented from flowing. Hence, it is unnecessary to provide a marginal region around the die-bonding region of the metal plate, which implements a miniaturized plastic package and a miniaturized RF-driven semiconductor device.

A fifth RF-driven semiconductor device according to the present invention comprises: an RF-driven semiconductor chip a metal plate having the semiconductor chip die-bonded thereto via a bonding material supplied to a back face of the semiconductor chip; a plastic package having the semiconductor chip and the metal plate molded therein; outer leads protruding outwardly from a side face of the plastic package and electrically connected to a signal electrode of the semiconductor chip; and a projecting portion formed on the metal plate, the projecting portion having a plan configuration slightly larger in size than a plan configuration of the semiconductor chip, the semiconductor chip being die-bonded to a top face of the projecting portion formed on the metal plate.

In the fifth RF-driven semiconductor device, the metal plate is formed with the projecting portion having the plan configuration slightly larger in size than the plan configuration of the semiconductor chip such that the semiconductor chip is die-bonded to the top face of the projecting portion formed on the metal plate. Accordingly, even when the bonding material is supplied in an amount sufficient to be pushed out of the back side of the semiconductor chip, it is attached to the side faces of the projecting portion and less likely to spread out to the area surrounding the die-bonding region. Hence, it is unnecessary to provide a marginal region around the die-bonding region of the metal plate, which implements a miniaturized plastic package and a miniaturized RF-driven semiconductor device.

A sixth RF-driven semiconductor device according to the present invention comprises: first and second RF-driven semiconductor chips; a metal plate having the first and second semiconductor chips die-bonded thereto via a bonding material supplied to respective back faces of the first and second semiconductor chips; a plastic package having the first and second semiconductor chips and the metal plate molded therein; outer leads protruding outwardly from a side face of the plastic package and electrically connected to respective signal electrodes of the first and second semiconductor chips; and a recessed portion formed in the region of the metal plate interposed between a first region to which the first semiconductor chip is to be die-bonded and a second region to which the second semiconductor chip is to be die-bonded, the recessed portion accommodating the bonding material pushed out of the back side of at least one of the first and second semiconductor chips.

In the sixth RF-driven semiconductor device, the metal plate is formed with the recessed portion extending between the first region to which the first semiconductor chip is to be die-bonded and the second region to which the second semiconductor chip is to be die-bonded such that the bonding material pushed out of the back side of at least one of the first and second semiconductor chips is accommodated in the recessed portion. Consequently, the bonding material pushed out of the back side of that one of the first and second semiconductor chips die-bonded earlier is prevented from entering the region to which the other of the first and second semiconductor chips is to be die-bonded later. The arrangement achieves a reduced spacing between the first and second semiconductor chips and implements a miniaturized plastic package having the plurality of semiconductor chips molded therein and a miniaturized RF-driven semiconductor device.

A seventh RF-driven semiconductor device according to the present invention comprises: first and second RF-driven semiconductor chips; a metal plate having the first and second semiconductor chips die-bonded thereto via a bonding material supplied to respective back faces of the first and second semiconductor chips; a plastic package having the first and second semiconductor chips and the metal plate molded therein; outer leads protruding outwardly from a side face of the plastic package and electrically connected to respective signal electrodes of the first and second semiconductor chips; and a projecting portion formed on the region of the metal plate interposed between a first region to which the first semiconductor chip is to be die-bonded and a second region to which the second semiconductor chip is to be die-bonded, the projecting portion preventing the bonding material pushed out of the back side of at least one of the first and second semiconductor chips from flowing.

In the seventh RF-driven semiconductor device, the metal plate is formed with the projecting portion extending between the first region to which the first semiconductor chip is to be die-bonded and the second region to which the second semiconductor chip is to be die-bonded such that the bonding material pushed out of the back side of at least one of the first and second semiconductor chips is prevented from flowing. Consequently, the bonding material pushed out of the back side of that one of the first and second semiconductor chips die-bonded earlier is prevented from entering the region to which the other of the first and second semiconductor chips is to be die-bonded later. The arrangement achieves a reduced spacing between the first and second semiconductor chips and implements a miniaturized plastic package having the plurality of semiconductor chips molded therein and a miniaturized RF-driven semiconductor device.

An eighth RF-driven semiconductor device according to the present invention comprises: first and second RF-driven semiconductor chips; a metal plate having the first and second semiconductor chips die-bonded thereto via a bonding material supplied to respective back faces of the first and second semiconductor chips; a plastic package having the first and second semiconductor chips and the metal plate molded therein; outer leads protruding outwardly from a side face of the plastic package and electrically connected to respective signal electrodes of the first and second semiconductor chips; a first recessed portion formed in the metal plate, the first recessed portion having a plan configuration slightly larger in size than a plan configuration of the first semiconductor chip; and a second recessed portion formed in the metal plate, the second recessed portion having a plan configuration slightly larger in size than a plan configuration of the second semiconductor chip, the first semiconductor chip being die-bonded to a bottom face of the first recessed portion formed in the metal plate, the second semiconductor chip being die-bonded to a bottom face of the second recessed portion formed in the metal plate.

In the eighth RF-driven semiconductor device, the metal plate is formed with the first recessed portion having the plan configuration slightly larger in size than the plan configuration of the first semiconductor chip such that the first semiconductor chip is die-bonded to the bottom face of the first recessed portion formed in the metal plate. The metal plate is also formed with the second recessed portion having the plan configuration slightly larger in size than the plan configuration of the second semiconductor chip such that the second semiconductor chip is die-bonded to the bottom face of the second recessed portion formed in the metal plate. Consequently, the bonding material pushed out of the back side of that one of the first and second semiconductor chips die-bonded earlier is prevented from entering the region to which the other of the first and second semiconductor chips is to be die-bonded later. The arrangement achieves a reduced spacing between the first and second semiconductor chips and implements a miniaturized plastic package having the plurality of semiconductor chips molded therein and a miniaturized RF-driven semiconductor device.

A ninth RF-driven semiconductor device according to the present invention comprises: first and second RF-driven semiconductor chips; a metal plate having the first and second semiconductor chips die-bonded thereto via a bonding material supplied to respective back faces of the first and second semiconductor chips; a plastic package having the first and second semiconductor chips and the metal plate molded therein; outer leads protruding outwardly from a side face of the plastic package and electrically connected to respective signal electrodes of the first and second semiconductor chips; a first projecting portion formed on the metal plate, the first projecting portion having a plan configuration slightly larger in size than a plan configuration of the first semiconductor chip; and a second projecting portion formed on the metal plate, the second projecting portion having a plan configuration slightly larger in size than a plan configuration of the second semiconductor chip, the first semiconductor chip being die-bonded to a top face of the first projecting portion formed on the metal plate, the second semiconductor chip being die-bonded to a top face of the second projecting portion formed on the metal plate.

In the ninth RF-driven semiconductor device, the metal plate is formed with the first projecting portion having the plan configuration slightly larger in size than the plan configuration of the first semiconductor chip such that the first semiconductor chip is die-bonded to the top face of the first recessed portion formed on the metal plate. The metal plate is also formed with the second projecting portion having the plan configuration slightly larger in size than the plan configuration of the second semiconductor chip such that the second semiconductor chip is die-bonded to the top face of the second recessed portion formed on the metal plate. Consequently, the bonding material pushed out of the back side of that one of the first and second semiconductor chips die-bonded earlier is prevented from entering the region to which the other of the first and second semiconductor chips is to be die-bonded later. The arrangement achieves a reduced spacing between the first and second semiconductor chips and implements a plastic package having the plurality of semiconductor chips molded therein and a miniaturized RF-driven semiconductor device.

BRIEF DESCRIPTION OF THE DRAWINGS

FIGS. 1(a) to 1(d) show an RF-driven semiconductor device according to a first embodiment of the present invention, of which FIG. 1(a) is a plan view, FIG. 1(b) is a cross-sectional view taken along the line I—I of FIG. 1(a), FIG. 1(c) is a front view, and FIG. 1(d) is a bottom view;

FIGS. 4(a) to 4(d) show an RF-driven semiconductor device according to a second embodiment of the present invention, of which FIG. 4(a) is a plan view, FIG. 4(b) is a cross-sectional view taken along the line IV—IV of FIG. 4(a), FIG. 4(c) is a front view, and FIG. 4(d) is a bottom view;

FIGS. 5(a) to 5(d) show an RF-driven semiconductor device according to a third embodiment of the present invention, of which FIG. 5(a) is a plan view, FIG. 5(b) is a cross-sectional view taken along the line V—V of FIG. 5(a), FIG. 5(c) is a front view, and FIG. 5(d) is a bottom view;

FIGS. 10(a) and 10(b) show an RF-driven semiconductor device according to a fifth embodiment of the present invention, of which FIG. 10(a) is a plan view and FIG. 10(b) is a cross-sectional view taken along the line X—X of FIG. 10(a);

FIGS. 12(a) and 12(b) show an RF-driven semiconductor device according to a sixth embodiment of the present invention, of which FIG. 12(a) is a plan view and FIG. 12(b) is a cross-sectional view taken along the line XII—XII of FIG. 12(a);

FIGS. 13(a) and 13(b) show an RF-driven semiconductor device according to a seventh embodiment of the present invention, of which FIG. 13(a) is a plan view and FIG. 13(b) is a cross-sectional view taken along the line XIII—XIII of FIG. 13(a);

FIGS. 14(a) and 14(b) show an RF-driven semiconductor device according to an eighth embodiment of the present invention, of which FIG. 14(a) is a plan view and FIG. 14(b) is a cross-sectional view taken along the line XIV—XIV of FIG. 14(a);

FIGS. 15(a) and 15(b) show an RF-driven semiconductor device according to a ninth embodiment of the present invention, of which FIG. 15(a) is a plan view and FIG. 15(b) is a cross-sectional view taken along the line XV—XV of FIG. 15(a);

FIGS. 16(a) and 16(b) show an RF-driven semiconductor device according to a tenth embodiment of the present invention, of which FIG. 16(a) is a plan view and FIG. 16(b) is a cross-sectional view taken along the line XVI—XVI of FIG. 16(a);

FIGS. 17(a) to 17(d) show a semiconductor device according to a first conventional embodiment, of which FIG. 17(a) is a plan view, FIG. 17(b) is a cross-sectional view taken along the line XVII—XVII of FIG. 17(a), FIG. 17(c) is a front view, and FIG. 17(d) is a bottom view;

FIGS. 18(a) to 18(d) show a semiconductor device according to a second conventional embodiment, of which FIG. 18(a) is a plan view, FIG. 18(b) is a side view, FIG. 18(c) is a front view, and FIG. 18(d) is a bottom view;

FIGS. 19(a) and 19(b) show a semiconductor device according to a third conventional embodiment, of which FIG. 19(a) is a plan view and FIG. 19(b) is a side view; and FIGS. 20(a) ad 20(b) show a semiconductor device according to a fourth conventional embodiment, of which FIG. 20(a) is a plan view and FIG. 20(b) is a cross-sectional view taken along the line XX—XX of FIG. 20(a).

DETAILED DESCRIPTION OF THE INVENTION

Figure 1A:
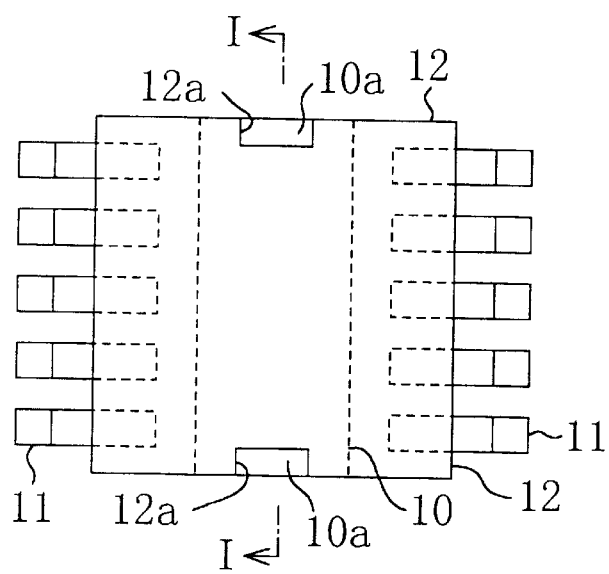

Referring now to the drawings, semiconductor devices according to the individual embodiments of the present invention will be described. For the sake of convenience, the following description assumes that the portions of the semiconductor devices located on the right and left sides of the drawings are termed the right and left portions of the semiconductor devices and that the portions of the semiconductor devices located in the upper and lower parts of the drawings are termed the rear and front portions of the semiconductor devices. However, the right and left portions of the semiconductor devices as well as the front and rear portions thereof are not limited to the aforesaid assumption.

(First Embodiment)

An RF-driven semiconductor device according to a first embodiment of the present invention will be described with reference to FIGS. 1 and 2.

Figure 1B:
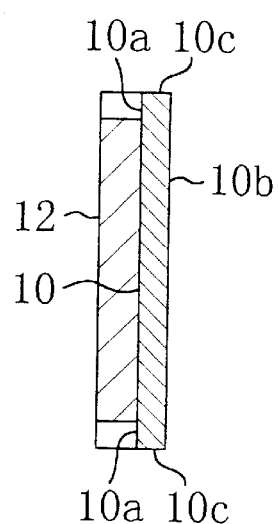
Figure 1C:
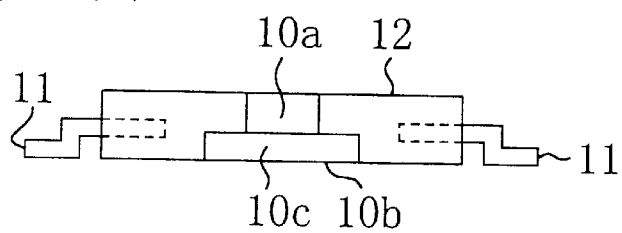
Figure 1D:
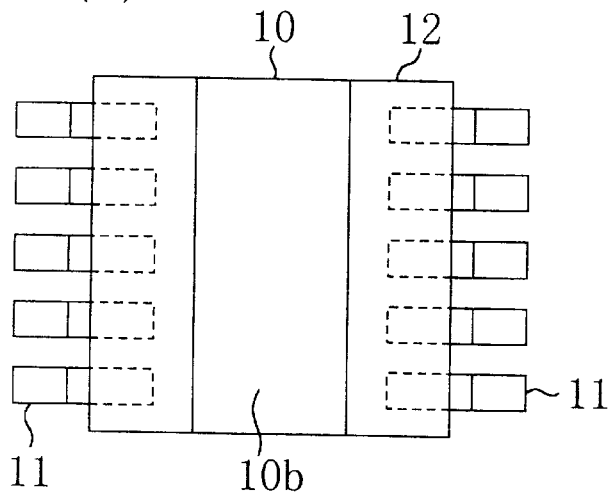
Figure 2:
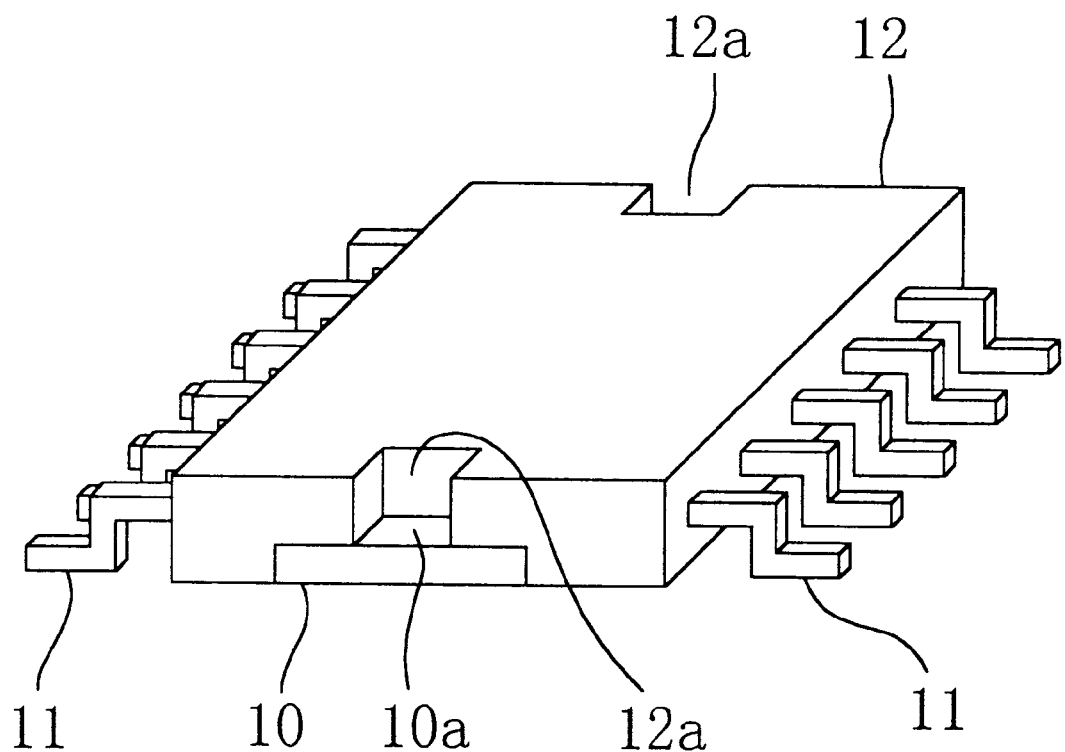
FIG. 2 is a perspective view of the RF-driven semiconductor device according to the first embodiment of the present invention.

FIGS. 1(a) to 1(d) and FIG. 2 show the RF-driven semiconductor device according to the first embodiment, of which FIG. 1(a) is a plan view, FIG. 1(b) is a cross-sectional view taken along the line I—I of FIG. 1(a), FIG. 1(c) is a front view, FIG. 1(d) is a bottom view, and FIG. 2 is a perspective view.

As shown in the drawings, an RF-driven semiconductor chip (not shown) is die-bonded to the top face of a metal plate 10 separated from a lead frame. The metal plate 10 and the semiconductor chip are molded together with outer leads 11 for connection with an external electrode, which are also separated from the lead frame, in a plastic package 12 in the form of a flat rectangular parallelepiped. The signal electrode of the semiconductor chip is electrically connected to the outer leads 11 via bonding wires or the like, though the drawing thereof is omitted here.

The first embodiment is characterized in that the outer leads 11 are protruding outwardly from the right and left side faces of the plastic package 12 and the metal plate 10 is exposed at the back face of the plastic package 12.

The metal plate 10 is not protruding from the front and rear side faces of the plastic package 12 and the front and rear said faces of the metal plate 10 are flush with the front and rear side faces of the plastic package 12. This prevents the plastic package from substantially increasing in size by the lengths of the projections of the metal plate as in the first conventional embodiment.

The front and rear portions of the plastic package 12 are centrally formed with respective cutaway portions 12a each in the form of a rectangular parallelepiped. The top face of the metal plate 10 is exposed through the cutaway portions 12a formed centrally in the front and rear portions of the plastic package 12 to form solder portions 10a.

The metal plate 10 also has an exposed portion 10b at its back face extending between the pair of opposed side faces thereof corresponding to the front and rear side faces of the plastic package 12 unprovided with the outer leads 11 (front and rear side faces of the metal plate 10). The exposed portion 10b and the solder portions 10a, each uncovered with the plastic package 12, are contiguous to each other via the front and rear side faces 10c of the metal plate 10.

Figure 6:
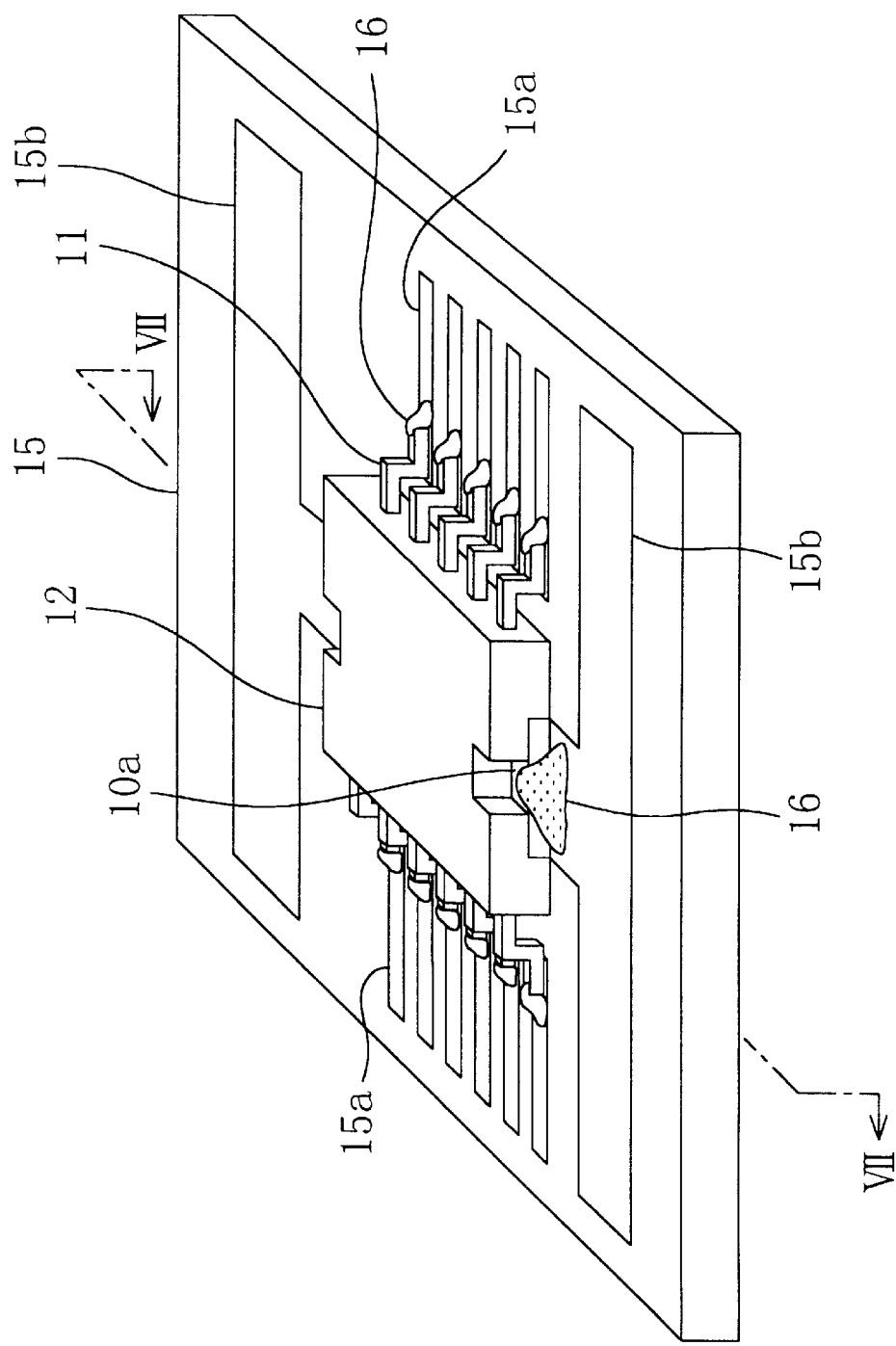
FIG. 6 is a perspective view of the RF-driven semiconductor device according to the first embodiment of the present invention, which has been mounted on a printed circuit board.
Figure 7:
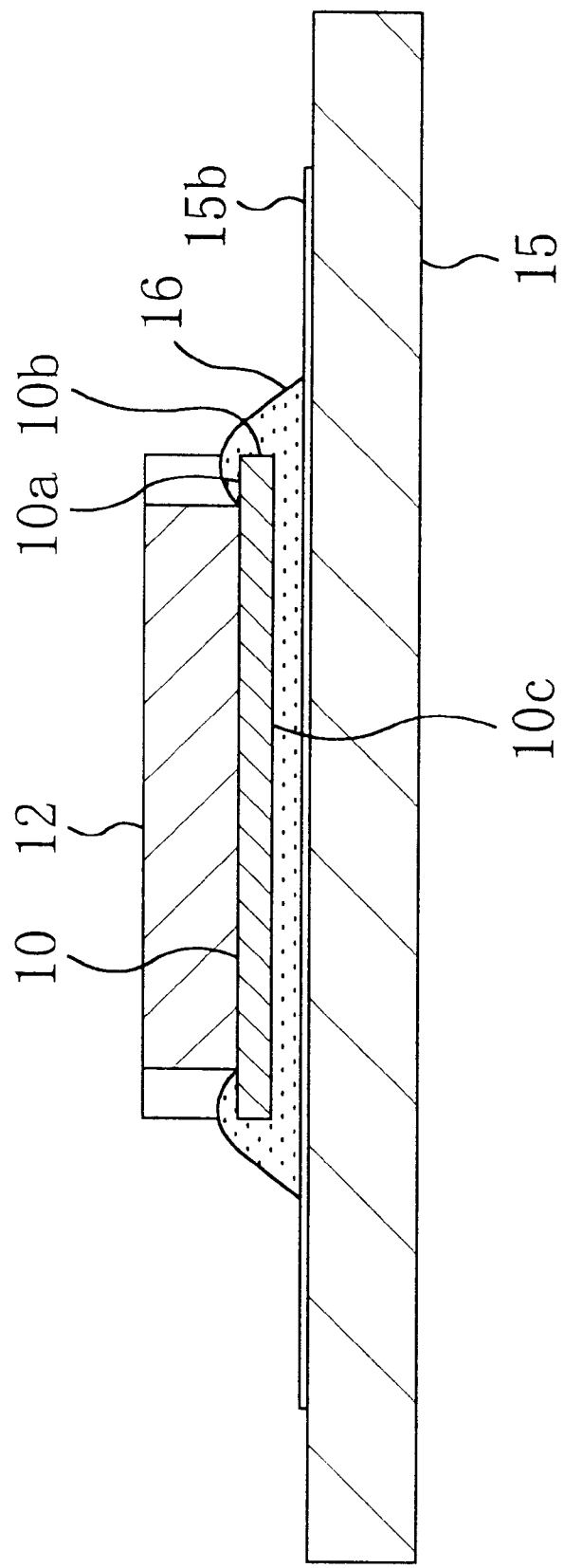
FIG. 7 is a cross-sectional view taken along the line VII—VII of FIG. 6 showing the RF-driven semiconductor device according to the first embodiment of the present invention, which has been mounted on the printed circuit board.

FIGS. 6 and 7 show a set of semiconductor devices in which the RF-driven semiconductor device according the first embodiment is mounted on a printed circuit board 15 of terminal equipment for mobile communication. FIG. 7 is a cross-sectional view taken along the line VII—VII of FIG. 6.

As shown in the drawings, after the plastic package 12 is placed on the printed circuit board 15 with a lead pattern 15a and a ground pattern 15b formed thereon, the lead pattern 15a is bonded to the outer leads 11 with a solder material 16, while the ground pattern 15b is bonded to the solder portions 10a of the metal plate 10 with the solder material 16.

The first embodiment is characterized in that the front and rear side faces 10c of the metal plate 10 are plated with a metal composed of solder, silver, or nickel having an excellent affinity for the solder material for the following reason. The lead frame is normally plated with such a metal as silver or nickel for improved adhesion to the solder material since the lead frame is composed of an iron-based metal such as a chromium-iron alloy and hence has poor adhesion to the solder material. However, the iron-based metal is exposed at the front and rear side faces 10c of the metal plate 10 separated from the lead frame and exhibits poor adhesion to the solder material. The front and rear side faces of the metal plate 10 have thus been plated with the metal having an excellent affinity for the solder material for improved adhesion to the solder material. As a result, all the portions of the metal plate 10 uncovered with the plastic package 12 are covered with a plate layer (covering member) made of the metal having an excellent affinity for the solder material. This improves bonding between the metal plate 10 and the ground pattern 15b.

Moreover, since the metal plate 10 has the exposed portion 10b at the back face thereof extending continuously between the pair of opposed side faces corresponding to the pair of opposed side faces of the plastic package 12 unprovided with the outer leads 11, the exposed portion 10b and the solder portions 10a each uncovered with the plastic package 12 are contiguous to each other via the front and rear side faces 10c of the metal plate 10. Accordingly, the metal plate 10 and hence the RF-driven semiconductor device are fastened to the printed circuit board 15 with the solder portions 10a, front and rear side faces 10c, and exposed portion 10b of the metal plate 10 arranged contiguously and bonded securely to the ground pattern 15b of the printed circuit board 15 for the following reason. The step of soldering the metal plate 10 to the ground pattern 15b of the printed circuit board 15 includes the application of the solder material 16 to the region of the ground pattern 15b to which the metal plate 10 is to be bonded, the placement of the RF-driven semiconductor device on the applied solder material 16, and the application of the solder material 16 to the solder portions 10a. Then, the printed circuit board 15 with the RF-driven semiconductor device disposed thereon is placed in an oven and heated. The heat in the oven is transmitted smoothly along the entire surface of the metal plate 10. This brings the solder material 16 applied onto the ground pattern 15b and solder portion 10a into an equally wet state, so that the metal plate 10 is securely fastened to the ground pattern 15b of the printed circuit board 15. The typical ground pattern 15b is extremely thin and transmits only a small amount of heat for bringing the solder material into the wet state.

Moreover, since the exposed portion of the metal plate 10 uncovered with the plastic package 12 is thoroughly covered with a plate layer made of a metal having an excellent affinity for the solder material in the first embodiment, the solder material applied onto the solder portions 10a and ground pattern 15b spreads smoothly in the wet state, which further ensures bonding between the back face of the metal plate 10 and the ground pattern 15b.

Furthermore, since the ground pattern 15b of the printed circuit board 15 has been bonded to the solder portions 10a of the metal plate 10 with the solder material 16, the grounding property of the metal plate 10 is improved and the solder material 16 presents a protruding configuration, so that the solder material 16 is easily inspected by visual inspection or by means of a television camera. This increases the reliability, productivity, and yield of the set of semiconductor devices composed of the RF-driven semiconductor device mounted on the printed circuit board 15.

In addition, since the solder portions 10a of the metal plate 10 are exposed through the cutaway portions 12a of the plastic package 12, the solder portions 10a of the metal plate 10 can be pressed against the ground electrode when an RF inspection is performed with respect to the RF-driven semiconductor device according to the first embodiment, which surely equalizes the potential at the metal plate 10 and the ground potential.

Figure 3:
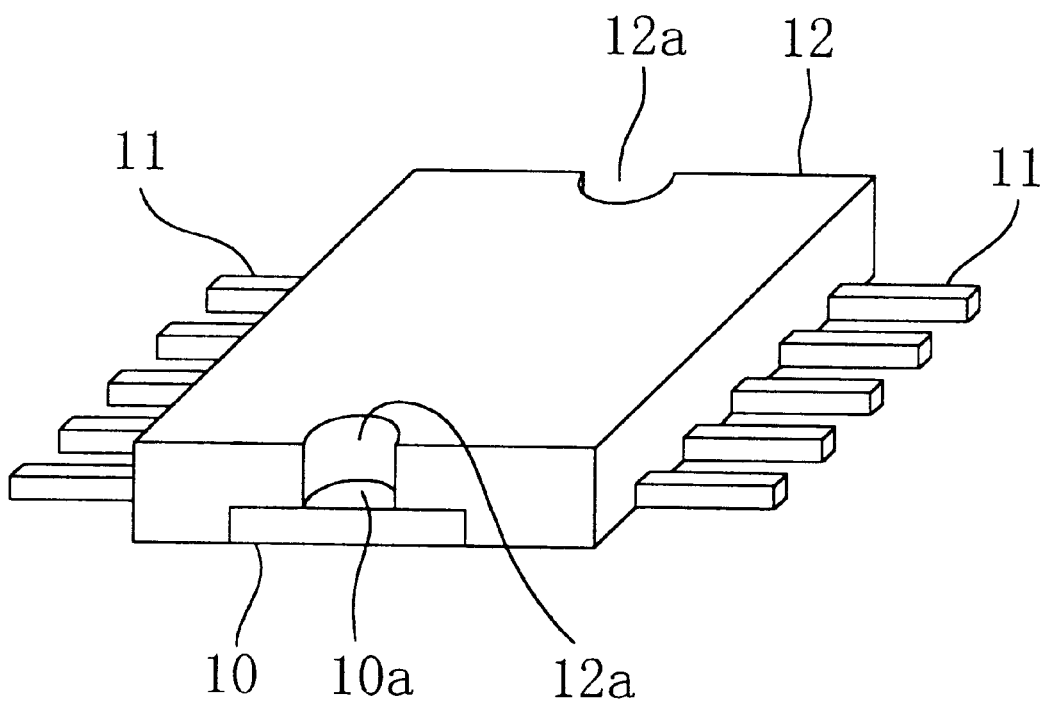
FIG. 3 is a perspective view of an RF-driven semiconductor device according to a variation of the first embodiment of the present invention.

FIG. 3 shows a variation of the RF-driven semiconductor device according to the first embodiment. As shown in FIG. 3, the outer leads 11 are extending linearly outwardly from the right and left side faces of the plastic package 12, while each of the cutaway portions 12a of the plastic package 12 presents a semicircular plan configuration. Accordingly, each of the solder portions 10a of the metal plate 10 also presents a semicircular configuration. Thus, the configuration of the outer lead 11, the plan configuration of the cutaway portion 12a in the plastic package 12, and the configuration of the solder portion 10a of the metal plate 10a are not particularly limited.

(Second Embodiment)

An RF-driven semiconductor device according to a second embodiment of the present invention will be described with reference to FIGS. 4.

Figure 4A:
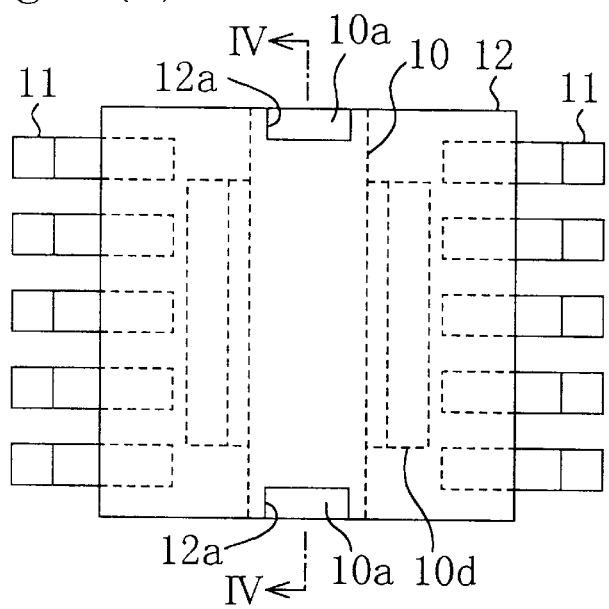
Figure 4B:
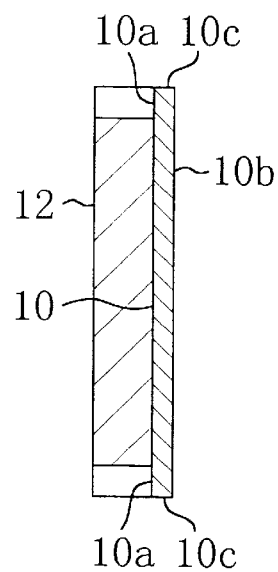
Figure 4C:
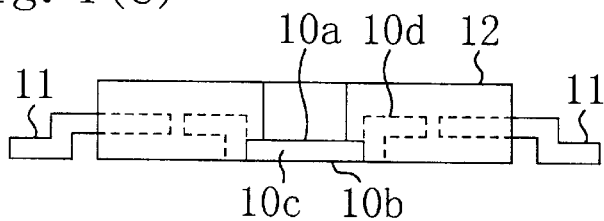
Figure 4D:
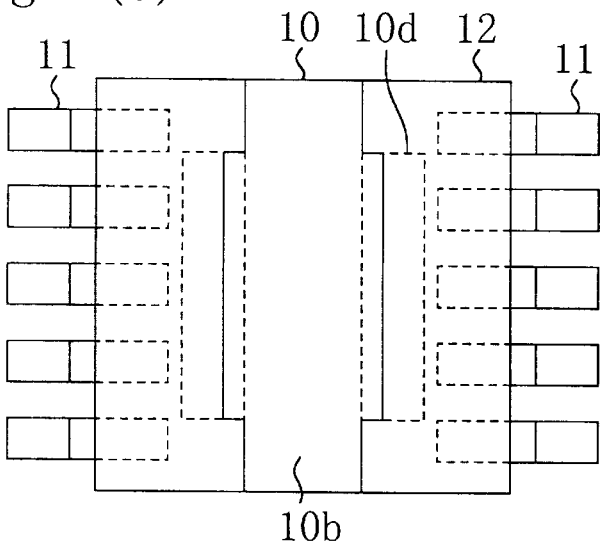

FIGS. 4(a) to 4(d) show the RF-driven semiconductor device according to the second embodiment, of which FIG. 4(a) is a plan view, FIG. 4(b) is a cross-sectional view taken along the line IV—IV of FIG. 4(a), FIG. 4(c) is a front view, and FIG. 4(d) is a bottom view.

As shown in the drawings, an RF-driven semiconductor chip (not shown) is die-bonded to the top face of a metal plate 10 separated from a lead frame. The metal plate 10 and the semiconductor chip are molded together with outer leads 11 also separated from the lead frame in a plastic package 12 in the form of a flat rectangular parallelepiped. The signal electrode of the semiconductor chip is electrically connected to the outer leads 11 via bonding wires or the like, though the drawing thereof is omitted here.

Similarly to the first embodiment, the outer leads 11 are protruding outwardly from the right and left side faces of the plastic package 12 and the metal plate 10 is exposed at the back face of the plastic package 12. The metal plate 10 is not protruding from the front and rear side faces of the plastic package 12 and the front and rear side faces of the metal plate 10 are flush with the front and rear side faces of the plastic package 12. This prevents the plastic package from substantially increasing in size by the lengths of the projections of the metal plate.

The front and rear portions of the plastic package 12 are centrally formed with respective cutaway portions 12a each in the form of a rectangular parallelepiped. The top face of the metal plate 10 is exposed through the cutaway portions 12a formed centrally in the front and rear portions of the plastic package 12 to form solder portions 10a.

The metal plate 10 also has an exposed portion 10b at the back face thereof extending between the pair of opposed side faces of the metal plate 10 (at the back face between the front and rear side faces of the metal plate 10) corresponding to the pair of opposed side faces of the plastic package 12 unprovided with the outer leads 11. The exposed portion 10b and the solder portions 10a each uncovered with the plastic package 12 are contiguous to each other via the front and rear side faces 10c of the metal plate 10.

The solder portions 10a, front and rear side faces 10c, and exposed portions 10b are contiguously uncovered with the plastic package 12, while the exposed portion of the metal plate 10 uncovered with the plastic package 12 is plated with a metal composed of a solder, silver, or nickel having an excellent affinity for a solder material. Consequently, the solder material applied onto the solder portions 10a and ground pattern of the printed circuit board spreads smoothly in the wet state, which ensures bonding between the metal plate 10 and the ground pattern.

The second embodiment is characterized in that the pair of opposed side faces of the metal plate 10 (right and left side faces of the metal plate 10) corresponding to the side faces of the plastic package 12 provided with the outer leads 11 are formed centrally with respective bending portions 10d extending upwardly and then horizontally away from the metal plate 10, which are confined in the plastic package 12. The bending portions 10d prevents the metal plate 10 from being detached from the plastic package 12 when a large tractive force or an external pressure is applied to the metal plate 10. Although the bending portion 10d has an L-shaped cross section in the second embodiment, the cross-sectional configuration of the bending portion 10d can be changed properly if required.

(Third Embodiment)

A semiconductor device according to a third embodiment of the present invention will be described with reference to FIGS. 5. FIGS. 5(a) to 5(d) show the semiconductor device according to the third embodiment, of which FIG. 5(a) is a plan view, FIG. 5(b) is a cross-sectional view taken along the line V—V of FIG. 5(a), FIG. 5(c) is a front view, and FIG. 5(d) is a bottom view.

As shown in the drawings, an RF-driven semiconductor chip (not shown) is die-bonded to the top face of a metal plate 30 separated from a lead frame, similarly to the first embodiment. The metal plate 30 and a semiconductor chip are molded together with outer leads 11 also separated from the lead frame in a plastic package 12 in the form of a flat rectangular parallelepiped. The signal electrode of the semiconductor chip is electrically connected to the outer leads 11 via bonding wires or the like, though the drawing thereof is omitted here.

The outer leads 11 are protruding outwardly from the right and left side faces of the plastic package 12 and the metal plate 30 is exposed at the back face of the plastic package 12. The metal plate 30 is not protruding from the front and rear side faces of the plastic package 12 and the front and rear side faces of the metal plate 30 are flush with the front and rear faces of the plastic package 12.

The front and rear portions of the plastic package 12 are centrally formed with respective cutaway portions 12a each in the form of a rectangular parallelepiped. The top face of the metal plate 30 is exposed through the cutaway portions 12a formed centrally in the front and rear portions of the plastic package 12 to form solder portions 30a.

The metal plate 30 also has an exposed portion 30b at the back face thereof extending between the pair of opposed side faces of the metal plate 30 corresponding to the pair of opposed side faces of the plastic package 12 unprovided with the outer leads 11. The exposed portion 30b and the solder portions 30a each uncovered with the plastic package 12 are contiguous to each other via the front and rear side faces 30c of the metal plate 30.

The solder portions 30a, front and rear side faces 30c, and exposed portion 30b are contiguously uncovered with the plastic package 12, while the exposed portion of the metal plate 30 uncovered with the plastic package 12 is plated with a metal composed of a solder, silver, or nickel having an excellent affinity for a solder material. Consequently, the solder material applied onto the solder portions 30a and ground pattern of the printed circuit board spreads smoothly in the wet state, which ensures bonding between the metal plate 30 and the ground pattern.

The third embodiment is characterized in that the pair of opposed side faces of the metal plate 30 (right and left side faces of the metal plate) corresponding to the pair of opposed side faces of the plastic package 12 provided with the outer leads 11 are composed respective sloped surfaces 30d downwardly tapered in cross section toward the bottom face of the metal plate 30, as shown in FIG. 5(c). Accordingly, the width $L_2$ of the metal plate 30 at the top face thereof is larger than the width $L_1$ of the metal plate 30 at the back face thereof. The arrangement improves the strength of bonding between the metal plate 30 and the plastic package 12 and prevents the metal plate 30 from being detached from the plastic package 12 when a large tractive force or an external pressure is applied to the metal plate 30.

(Fourth Embodiment)

Figure 8:
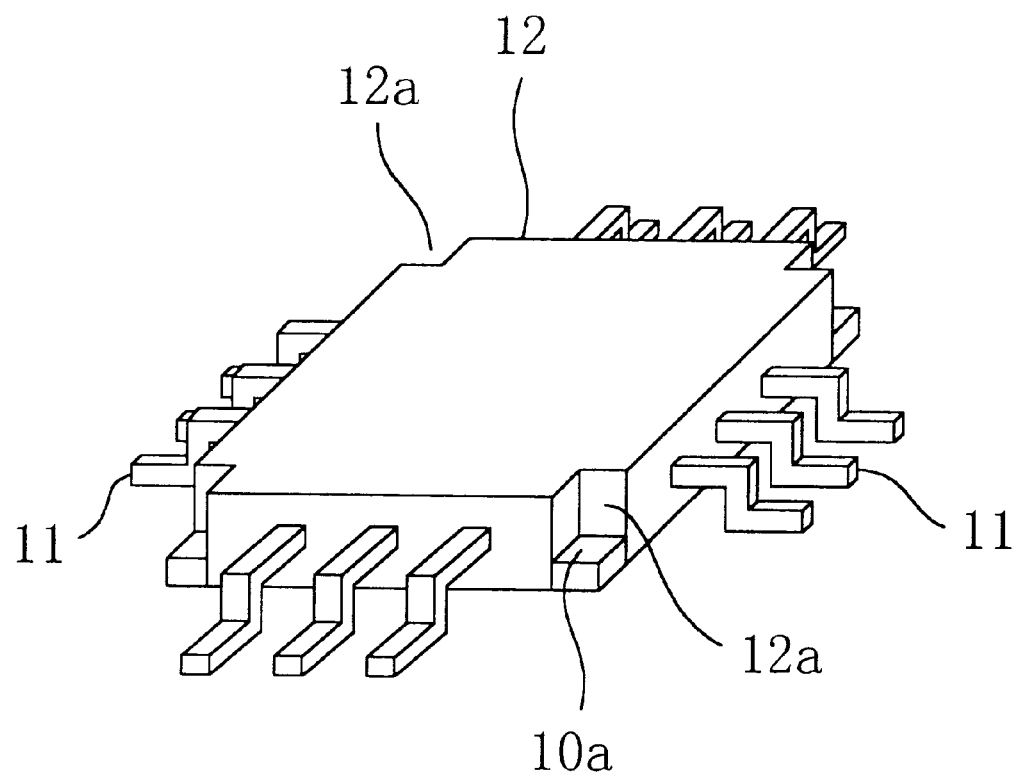
FIG. 8 is a perspective view of an RF-driven semiconductor device according to a fourth embodiment of the present invention.

An RF-driven semiconductor device according to a fourth embodiment of the present invention will be described with reference to FIGS. 8 and 9.

As shown in the drawings, an RF-driven semiconductor chip (not shown) is die-bonded to the top face of a metal plate 10 separated from a lead frame. The metal plate 10 and the semiconductor chip are molded together with outer leads 11 also separated from the lead frame in a plastic package 12 in the form of a flat rectangular parallelepiped. The signal electrode of the semiconductor chip is electrically connected to the outer leads 11 via bonding wires or the like, though the drawing thereof is omitted here.

The fourth embodiment is characterized in that the semiconductor chip has an RF-driven LSI circuit as well as a multi-pin structure in which the outer leads 11 are protruding outwardly from the four side faces of the plastic package 12. The metal plate 10 is exposed at the back face of the plastic package 2.

Figure 9:
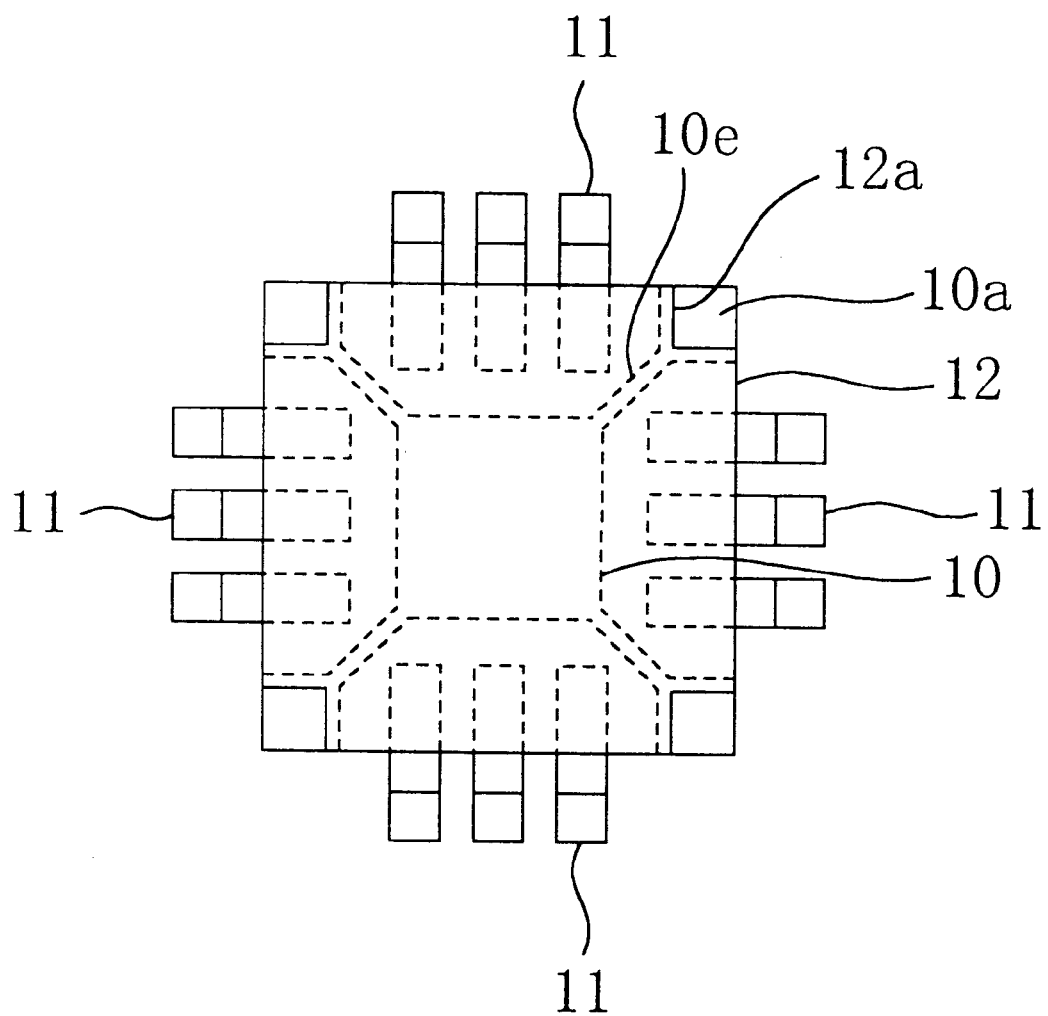
FIG. 9 is a plan view of the RF-driven semiconductor device according to the fourth embodiment of the present invention.

As shown in FIG. 9, the metal plate 10 has four extended portions 10e radially extending toward the four corners of the plastic package 12 and square-shaped solder portions 10a formed on the respective tips of the extended portions 10e.

The four corners of the plastic package 12 are formed with respective square-shaped cutaway portions 12a. The solder portions 10a of the metal plate 10 are exposed through the respective cutaway portions 12a of the plastic package 12.

After the plastic package 12 is placed on a printed circuit board having a lead pattern and a ground pattern formed on the surface thereof, the outer leads are bonded to the lead pattern with a solder material, while the solder portions 10a of the metal plate 10 are bonded to the ground pattern with the solder material, though the drawing thereof is omitted. The arrangement improves the grounding property of the metal plate 10 and forms the solder material into a protruding configuration, which can easily be recognized by visual inspection or the like. What results is a set of semiconductor devices with improved reliability composed of a semiconductor device having the multi-pin structure mounted on the printed circuit board.

(Fifth Embodiment)

A semiconductor device according to a fifth embodiment of the present invention will be described with reference to FIGS. 10 and 11.

Figure 10A:
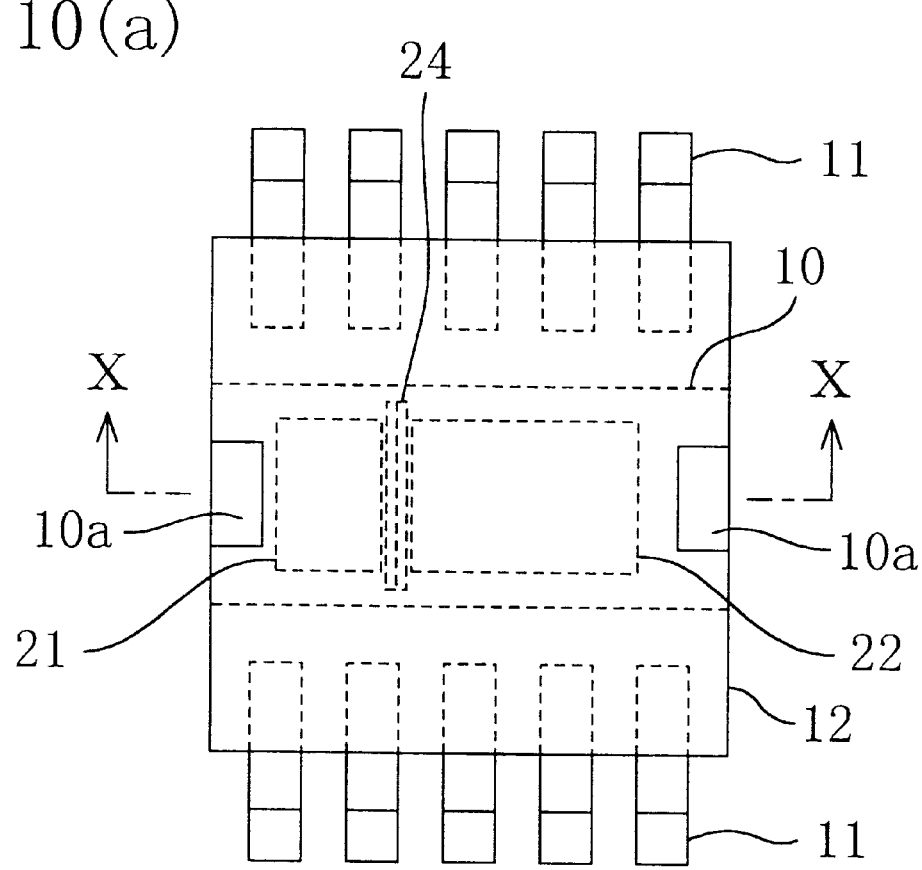
Figure 10B:
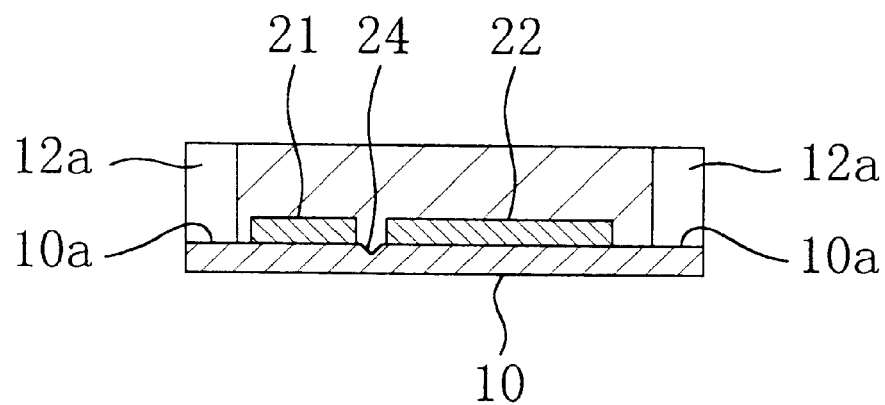
Figure 11:
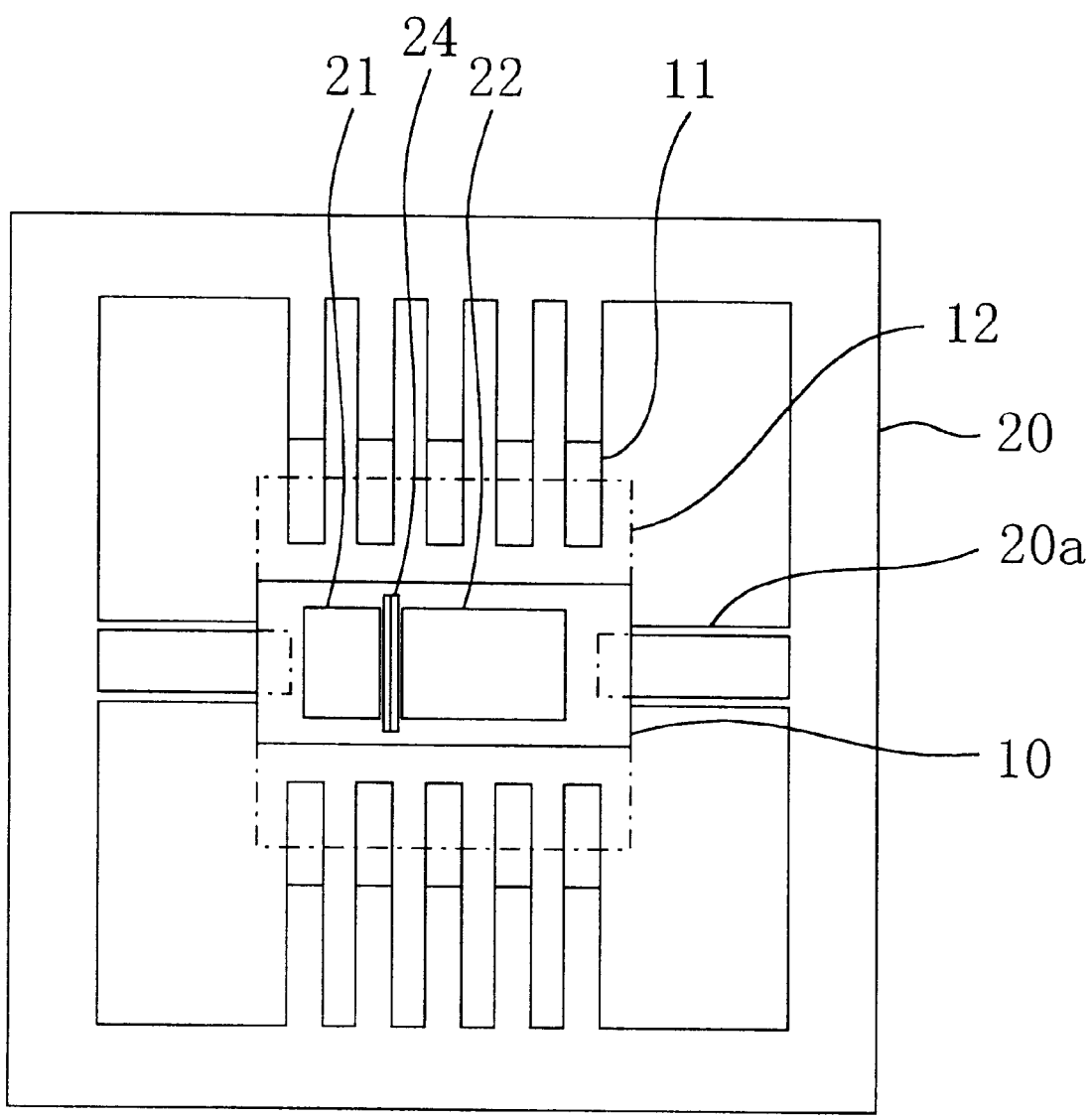
FIG. 11 is a plan view of a lead frame used in the RF-driven semiconductor device according to the fifth embodiment of the present invention.

FIGS. 10(a) and 10(b) show the RF-driven semiconductor device according to the fifth embodiment, of which FIG. 10(a) is a plan view, FIG. 10(b) is a cross-sectional view taken along the line X—X of FIG. 10(a), and FIG. 11 is a plan view of a lead frame 20.

As shown in the drawings, first and second RF-driven semiconductor chips 21 and 22 are die-bonded to the top face of a metal plate 10 separated from the lead frame 20 at suspended lead portions 20a. The metal plate 10 and the first and second semiconductor chips 21 and 22 are molded together with outer leads 11 also separated from the lead frame 20 in a plastic package 12 in the form of a flat rectangular parallelepiped. The respective signal electrodes of the first and second semiconductor chips 21 and 22 are electrically connected to the outer leads 11 via bonding wires or the like, though the drawing thereof is omitted here.

The outer leads 11 are protruding outwardly from the front and rear side faces of the plastic package 12, while the metal plate 10 is exposed at the back face of the plastic package 12. The metal plate 10 is not protruding from the right and left side faces of the plastic package 12 and the right and left side faces of the metal plate 10 are flush with the right and left side faces of the plastic package 12.

The right and left portions of the plastic package 12 are centrally formed with respective cutaway portions 12a each in the form of a rectangular parallelepiped. The top face of the metal plate 10 is exposed through the cutaway portions 12a formed centrally in the right and left portions of the plastic package 12 to form solder portions 10a.

The fifth embodiment is characterized in that the metal plate 10 is formed with a recessed portion 24 having a V-shaped cross section and vertically extending between the first region of the metal plate 10 to which the first semiconductor chip 21 is to be die-bonded and the second region of the metal plate 10 to which the second semiconductor chip 22 is to be die-bonded in FIG. 10(a).

When a bonding material made of a gold-silicon alloy, gold-lead alloy, silver paste, or the like is attached to the back face of that one of the first and second semiconductor chips 21 and 22 to be die-bonded earlier and the semiconductor chip is pressed against the metal plate 10, the bonding material is pushed out of the back side of the semiconductor chip die-bonded earlier and inclined to spread out toward the bonding region for the other of the first and second semiconductor chips 21 and 22 to be die-bonded later, but is eventually accommodated in the recessed portion 24 before entering the bonding region. Consequently, the bonding material pushed out of the back side of the semiconductor chip die-bonded earlier is prevented from entering the bonding region for the other semiconductor chip to be die-bonded later even when the spacing w between the first and second semiconductor chips 21 and 22 is small. In addition, it is no more necessary to moderate the amount of the bonding material to be attached to the back face of the semiconductor chip to be die-bonded earlier. Hence, a miniaturized plastic package can be implemented simultaneously with the implementation of an RF-driven semiconductor device with improved reliability and yield.

Preferably, the width and depth of the recessed portion 24 formed in the metal plate 10 are determined in consideration of the capacity to accommodate the bonding material and the strength of the metal plate 10, since the capacity to accommodate the bonding material increases as the width and depth of the recessed portion 24 increase, while the strength of the metal plate 10 decreases as the width and depth of the recessed portion 24 increase. In the case where the metal plate 10 has a thickness of 0.2 mm, the recessed portion 24 preferably has a width of about 0.2 mm and a depth of 0.1 mm or less. The settings can reduce the spacing w between first and second semiconductor chips 21 and 22 to about 0.2 mm, which is less than half the spacing of about 0.6 mm required in the conventional structure.

As described above, the fifth embodiment can minimize the lateral dimension of the plastic package 12 since the right and left side faces of the metal plate 10 are flush with the right and left side faces of the plastic package 12 and the recessed portion 24 is formed between the die-bonding region for the first semiconductor chip 21 and the second die-bonding region for the second semiconductor chip 22.

(Sixth Embodiment)

An RF-driven semiconductor device according to a sixth embodiment of the present invention will be described with reference to FIGS. 12.

Figure 12A:
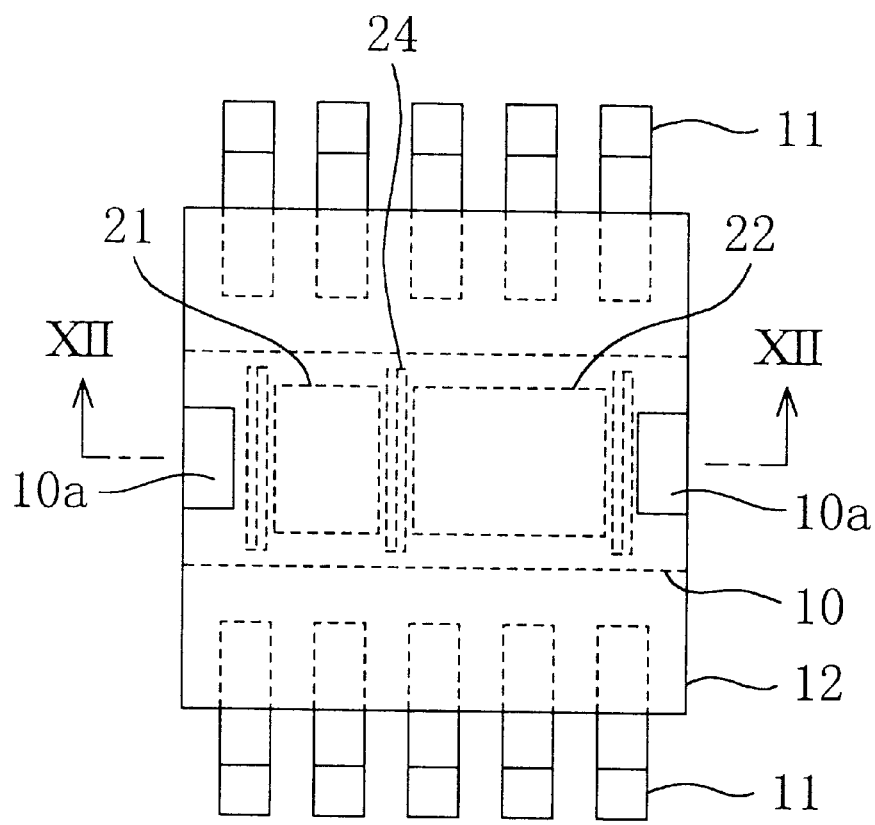
Figure 12B:
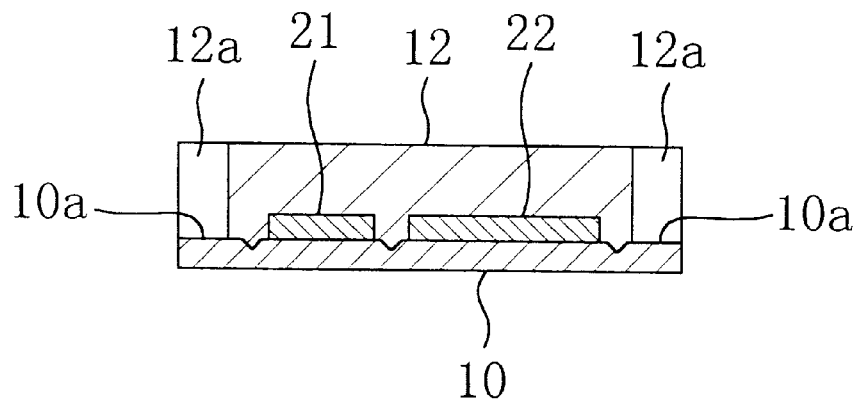

FIGS. 12(a) and 12(b) show the RF-driven semiconductor device according to the sixth embodiment, of which FIG. 12(a) is a plan view and FIG. 12(b) is a cross-sectional view taken along the line XII—XII of FIG. 12(a).

As shown in the drawings, first and second RF-driven semiconductor chips 21 and 22 are die-bonded to the top face of a metal plate 10, similarly to the fifth embodiment. The metal plate 10 and the first and second semiconductor chips 21 and 22 are molded in a plastic package 12. Outer leads 11 are protruding outwardly from the front and rear side faces of the plastic package 12, while the metal plate 10 is exposed at the back face of the plastic package 12. The metal plate 10 is not protruding from the right and left side faces of the plastic package 12 and the right and left side faces of the metal plate 10 are flush with the right and left side faces of the plastic package 12.

The right and left portions of the plastic package 12 are centrally formed with respective cutaway portions 12a each in the form of a rectangular parallelepiped. The top face of the metal plate 10 is exposed through the cutaway portions 12a centrally formed in the right and left portions of the plastic package 12 to form solder portions 10a.

The sixth embodiment is characterized in that the metal plate 10 is formed with respective recessed portions 24 having V-shaped cross sections and vertically extending between a first region of the metal plate 10 to which the first semiconductor chip 21 is to be die-bonded and a second region to which the second semiconductor chip 22 is to be die-bonded, between the first region and the solder portion 10a on the left side of the metal plate 10, and between the second region and the solder portion 10a on the right side of the metal plate 10 in FIG. 12(a).

Since the bonding material pushed out of the back side of each of the first and second semiconductor chips 21 and 22 is accommodated in the recessed portions 24 in the vicinity, the bonding material is prevented from entering the adjacent bonding regions for the semiconductor chips or the solder portions 10a of the metal plate 10. Consequently, the spacing between the first and second semiconductor chips 21 and 22 and the spacing between each of the first and second semiconductor chips 21 and 22 and the solder portion 10a can be reduced, which implements a miniaturized plastic package 12 as well as an RF-driven semiconductor device with improved reliability and yield.

(Seventh Embodiment)

A semiconductor device according to a seventh embodiment of the present invention will be described with reference to FIGS. 13(a) and 13(b).

Figure 13A:
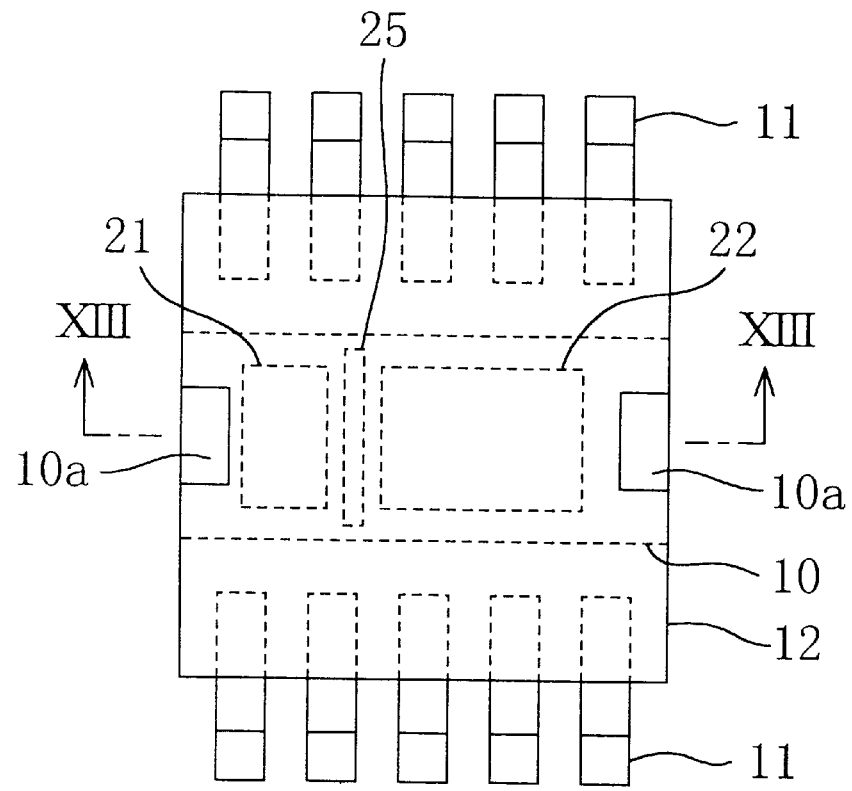
Figure 13B:
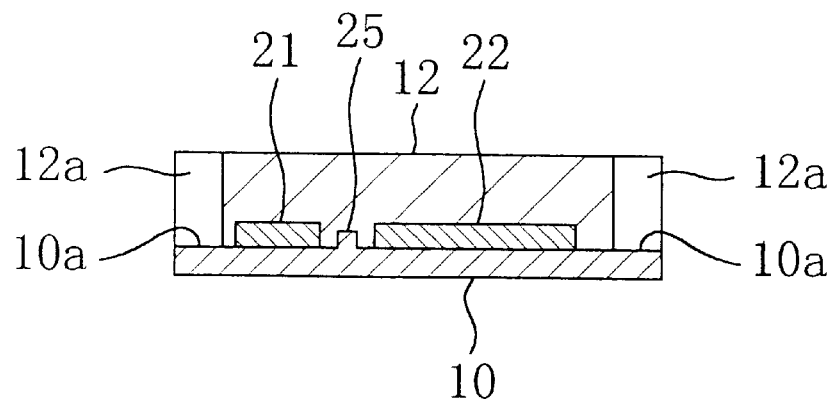

FIGS. 13(a) and 13(b) show the semiconductor device according to the seventh embodiment, of which FIG. 13(a) is a plan view and FIG. 13(b) is a cross-sectional view taken along the line XIII—XIII of FIG. 13(a).

As shown in the drawings, first and second RF-driven semiconductor chips 21 and 22 are die-bonded to the top face of a metal plate 10, similarly to the fifth embodiment. The metal plate 10 and the first and second semiconductor chips 21 and 22 are molded in a plastic package 12. Outer leads 11 are protruding outwardly from the front and rear side faces of the plastic package 12, while the metal plate 10 is exposed at the back face of the plastic package 12. The metal plate 10 is not protruding from the right and left side faces of the plastic package 12 and the right and left side faces of the metal plate 10 are flush with the right and left side faces of the plastic package 12.

The right and left portions of the plastic package 12 are centrally formed with respective cutaway portions 12a each in the form of a rectangular parallelepiped. The top face of the metal plate 10 is exposed through the cutaway portions 12a formed centrally in the right and left portions of the plastic package 12 to form solder portions 10a.

The seventh embodiment is characterized in that the metal plate 10 is formed with a projecting portion 25 vertically extending between a first region to which the first semiconductor chip 21 is to be die-bonded and a second region to which the second semiconductor chip 22 is to be die-bonded in FIG. 13(a).

The projecting portion 25 prevents the bonding material pushed out of the back side of that one of the first and second semiconductor chips 21 and 22 die-bonded earlier from entering the bonding region for the other one of the first and second semiconductor chips 21 and 22 to be die-bonded later. Consequently, the spacing between the first and second semiconductor chips 21 and 22 can be reduced, which implements a miniaturized plastic package 12 as well as an RF-driven semiconductor device with improved reliability and yield.

(Eighth Embodiment)

An RF-driven semiconductor device according to an eighth embodiment of the present invention will be described with reference to FIGS. 14.

Figure 14A:
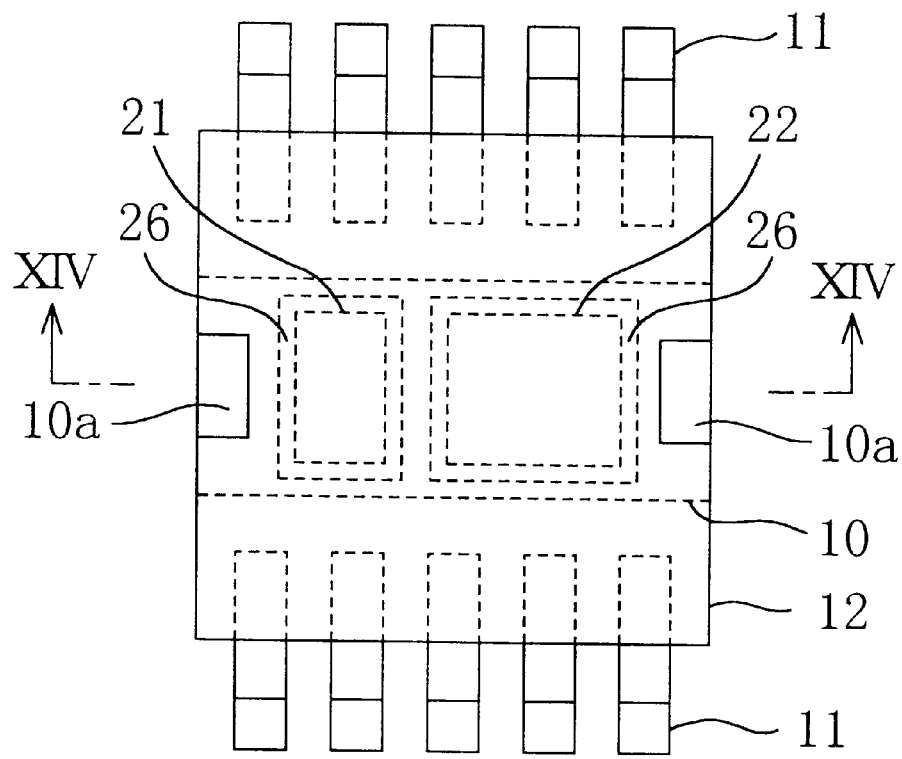
Figure 14B:
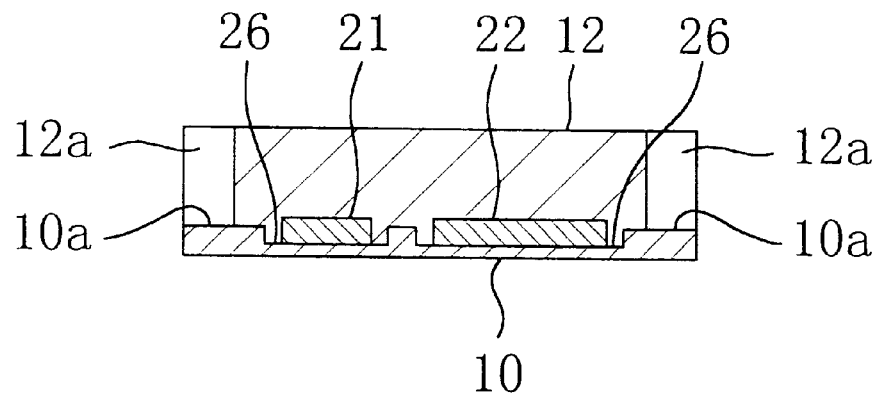

FIGS. 14(a) and 14(b) show the RF-driven semiconductor device according to an eighth embodiment, of which FIG. 14(a) is a plan view and FIG. 14(b) is a cross-sectional view taken along the line XIV—XIV of FIG. 14(a).

As shown in the drawings, first and second RF-driven semiconductor chips 21 and 22 are die-bonded to the top face of a metal plate 10, similarly to the fifth embodiment. The metal plate 10 and the first and second semiconductor chips 21 and 22 are molded in a plastic package 12. Outer leads 11 are protruding outwardly from the front and rear side faces of the plastic package 12, while the metal plate 10 is exposed at the back face of the plastic package 12. The metal plate 10 is not protruding from the right and left side faces of the plastic package 12 and the right and left side faces of the metal plate 10 are flush with the right and left side faces of the plastic package 12.

The right and left portions of the plastic package 12 are centrally formed with respective cutaway portions 12a each in the form of a rectangular parallelepiped. The top face of the metal plate 10 is exposed through the cutaway portions 12a formed centrally in the right and left portions of the plastic package 12 to form solder portions 10a.

The eighth embodiment is characterized in that respective recessed portions 26 are formed in the first and second regions of the metal plate 10 to which the first and second semiconductor chips 21 and 22 are to be die-bonded, respectively. The recessed portions 26 have individual plan configurations slightly larger in size than the first and second semiconductor chips 21 and 22 to be die-bonded so that the first and second semiconductor chips 21 and 22 are die-bonded to the respective bottom faces of the recessed portions 26 formed in the metal plate 10.

With the arrangement, the bonding material pushed out of the back side of each of the first and second semiconductor chips 21 and 22 is prevented from flowing out of the corresponding recessed portion 26 and entering the bonding region for the other semiconductor chip. Consequently, the spacing between the first and second semiconductor chips 21 and 22 can be reduced, which implements a miniaturized plastic package 12 as well as an RF-driven semiconductor device with improved reliability and yield.

(Ninth Embodiment)

An RF-driven semiconductor device according to a ninth embodiment of the present invention will be described with reference to FIGS. 15.

Figure 15A:
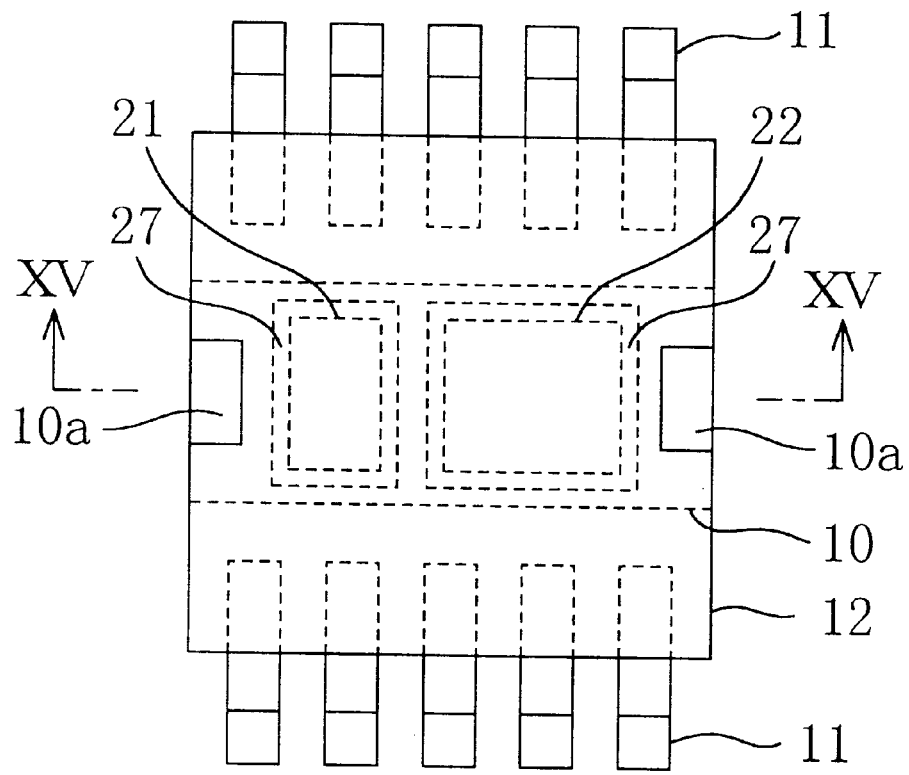
Figure 15B:
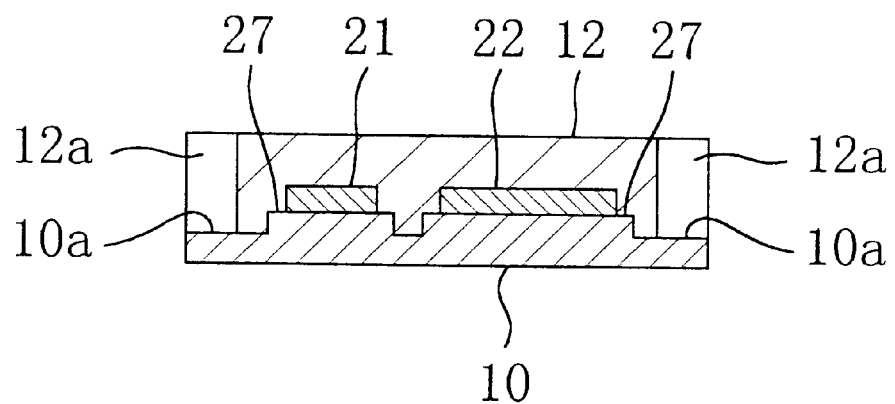

FIGS. 15(a) and 15(b) show the RF-driven semiconductor device according to the ninth embodiment, of which FIG. 15(a) is a plan view and FIG. 15(b) is a cross-sectional view taken along the line XV—XV of FIG. 15(a).

As shown in the drawings, first and second RF-driven semiconductor chips 21 and 22 are die-bonded to the top face of a metal plate 10, similarly to the fifth embodiment. The metal plate 10 and the first and second semiconductor chips 21 and 22 are molded in a plastic package 12. Outer leads 11 are extending outwardly from the front and rear side faces of the plastic package 12, while the metal plate 10 is exposed at the back face of the plastic package 12. The metal plate 10 is not protruding from the right and left side faces of the plastic package 12 and the right and left side faces of the metal plate 10 are flush with the right and left side faces of the plastic package 12.

The right and left portions of the plastic package 12 are centrally formed with respective cutaway portions 12a each in the form of a rectangular parallelepiped. The top face of the metal plate 10 is exposed through the cutaway portions 12a formed centrally in the right and left portions of the plastic package 12 to form solder portions 10a.

The ninth embodiment is characterized in that respective projecting portions 27 are formed on the first and second regions of the metal plate 10 to which the first and second semiconductor chips 21 and 22 are to be die-bonded, respectively. The projecting portions 27 have individual plan configurations slightly larger in size than the first and second semiconductor chips 21 and 22 to be die-bonded so that the first and second semiconductor chips 21 and 22 are die-bonded to the top faces of the corresponding projecting portions 27 formed on the metal plate 10.

With the arrangement, the bonding material pushed out of the back side of each of the first and second semiconductor chips 21 and 22 is attached to the side faces of the corresponding projecting portion 27 and will not enter the bonding region for the other semiconductor chip. Consequently, the spacing between the first and second semiconductor chips 21 and 22 can be reduced, which implements a miniaturized plastic package 12 as well as an RF-driven semiconductor device with improved reliability and yield.

(Tenth Embodiment)

A semiconductor device according to a tenth embodiment of the present invention will be described with reference to FIGS. 16.

Figure 16A:
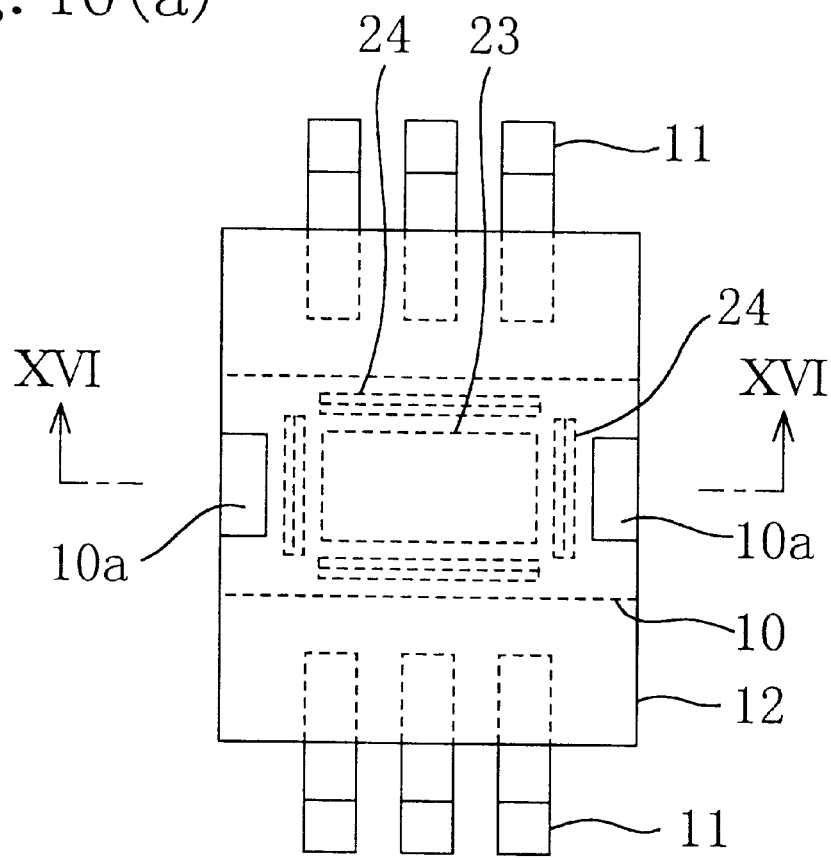
Figure 16B:
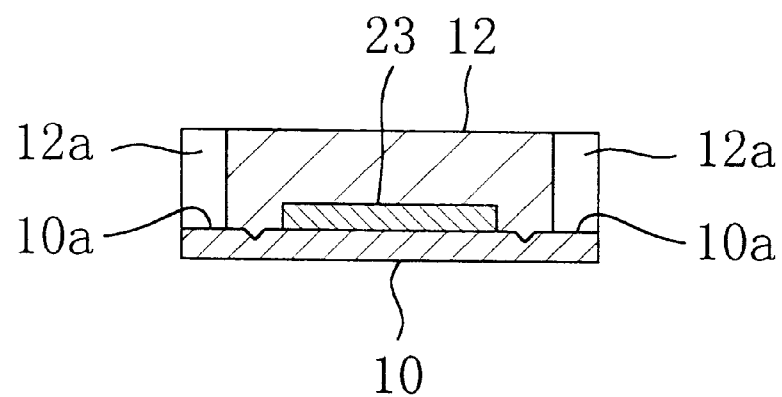
Figure 17A:
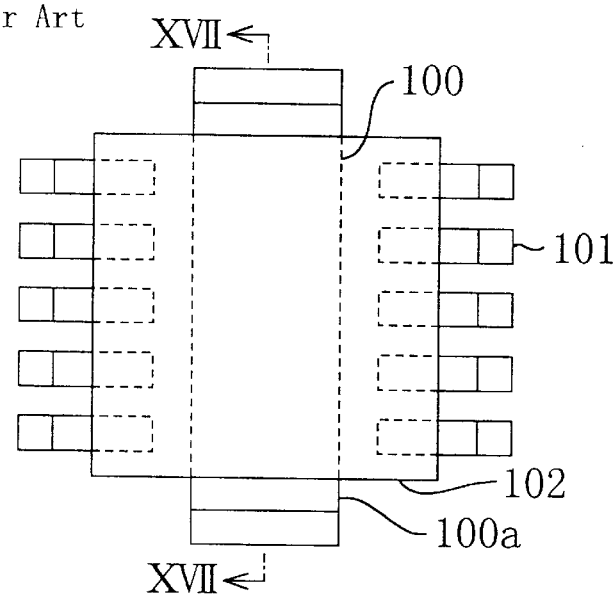
Figure 17B:
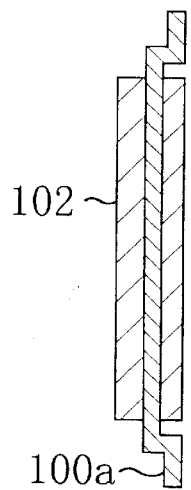
Figure 17C:
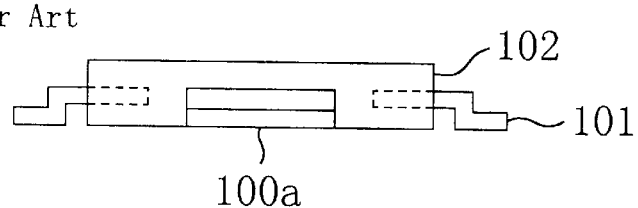
Figure 17D:
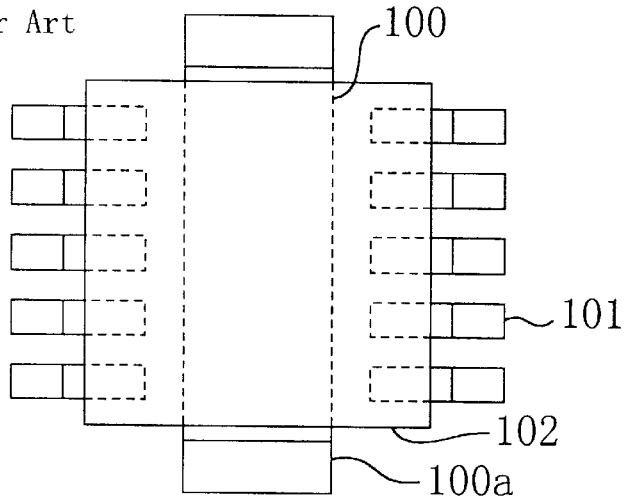
Figure 18A:
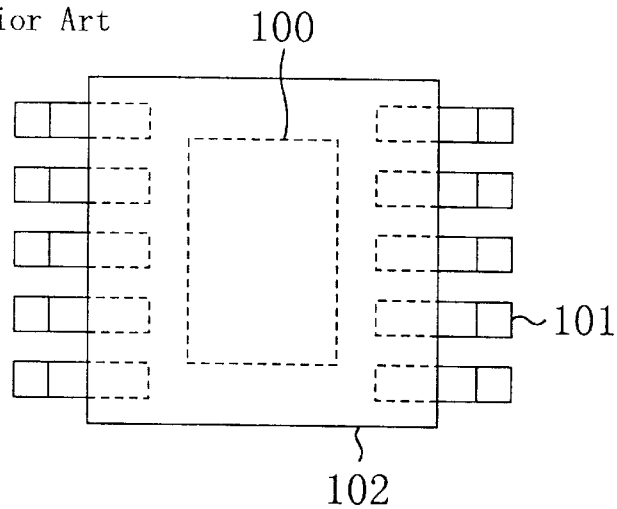
Figure 18B:
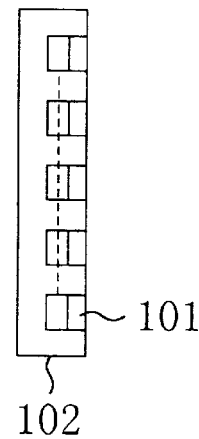
Figure 18C:
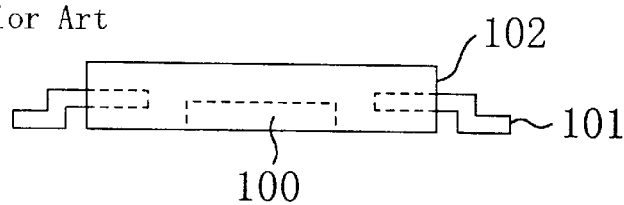
Figure 18D:
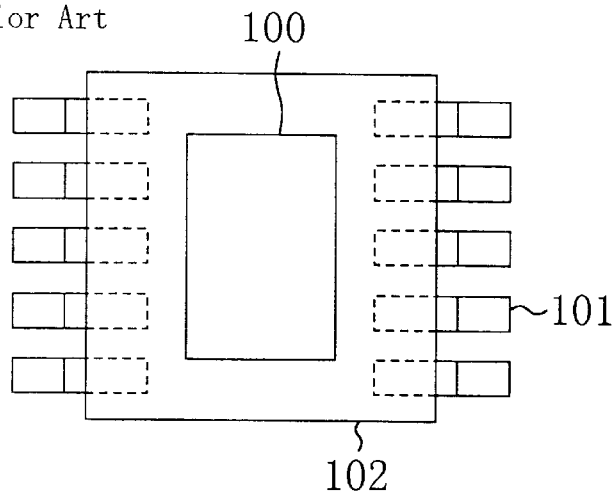
Figure 20A:
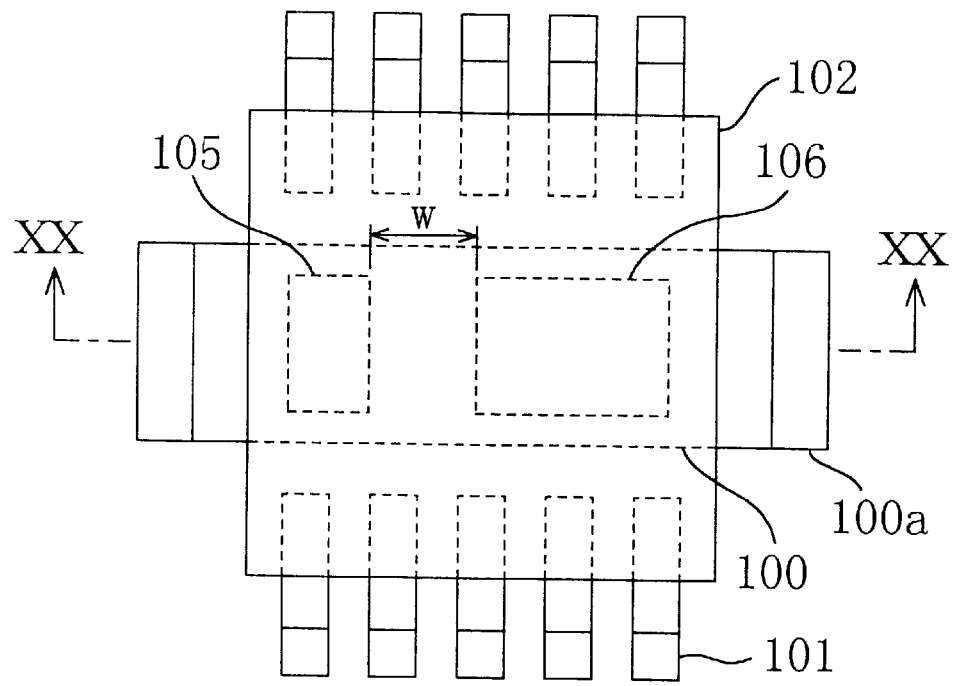
Figure 20B:
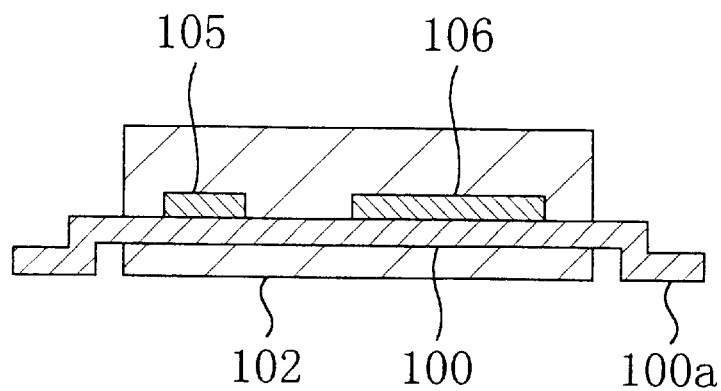

FIGS. 16(a) and 16(b) show the RF-driven semiconductor device according to the tenth embodiment, of which FIG. 16(a) is a plan view and FIG. 16(b) is a cross-sectional view taken along the line XVI—XVI.

As shown in the drawings, an RF-driven semiconductor chip 23 is die-bonded to a metal plate 10. The metal plate 10 and the semiconductor chip 23 are molded in a plastic package 12. Outer leads 11 are protruding from the front and rear side faces of the plastic package 12, while the metal plate 10 is exposed at the back face of the plastic package 12. The metal plate 10 is not protruding from the right and left side faces of the plastic package 12 and the right and left side faces of the metal plate 10 are flush with the right and left side faces of the plastic package 12.

The right and left portions of the plastic package 12 are centrally formed with respective cutaway portions 12a each in the form of a rectangular parallelepiped. The top face of the metal plate 10 is exposed through the cutaway portions 12a formed centrally in the right and left portions of the plastic package 12 to form solder portions 10a.

The tenth embodiment is characterized in that the metal plate 10 is formed with recessed portions 24 having V-shaped cross sections and extending along the respective sides of the semiconductor chip 23 in such a manner as to surround the region to which the semiconductor chip 23 is to be die-bonded in the proximity thereof.

Accordingly, the bonding material pushed out of the back side of the semiconductor chip 23 is accommodated in the recessed portions 24 and will not flow to the solder portions 10a on the top face of the metal plate 10 or to the back face of the metal plate 10. As a result, the bonding region for the semiconductor chip 23 and the plastic package 12 can be reduced in size.

If the width of each of the recessed portions 24 is assumed to be 0.2 mm, the length of each side of the bonding region for the semiconductor chip 23 can be reduced to a value obtained by adding 0.4 mm to the length of each side of the semiconductor chip 23, which is smaller by 0.8 mm than the conventional length of each side of the bonding region for the semiconductor chip calculated by adding 0.6×2=1.2 mm to the length of each side of the semiconductor chip. The arrangement enables a further reduction of 0.8 mm in the length of each side of the plastic package 12, which has already been reduced from conventional 5 mm to 3 mm because of the right and left side faces of the metal plate 10 being flush with the right and left side faces of the plastic package 12, thereby contributing to further miniaturization of the RF-driven semiconductor device.

We claim:

1. An RF-driven semiconductor device mounted on a printed circuit board having a ground pattern, comprising:

an RF-driven semiconductor chip;

a metal plate having said semiconductor chip die-bonded to a top face thereof;

a plastic package in the shape of a rectangular parallelepiped having said semiconductor chip and said metal plate molded therein, said metal plate having an exposed back face and not protruding from the periphery of said plastic package;

outer leads protruding outwardly from a pair of opposite side faces of said plastic package and electrically connected to a signal electrode of said semiconductor chip; and a pair of solder portions which are soldered to the ground pattern of said printed circuit board, said pair of solder portions formed by cutting away a pair of opposite edge portions of said plastic package to expose portions of the top face of said metal plate, said pair of opposite edge portions corresponding to a different pair of opposite side faces of said metal plate from which no outer leads protrude, wherein said exposed back face of said metal plate, said different pair of opposite side faces of said metal plate and said solder portions, which form a continuous face not covered by said plastic package, are covered with a covering member composed of a material having an affinity for a solder material.

2. An RF-driven semiconductor device mounted on a printed circuit board having a ground pattern, comprising:

an RF-driven semiconductor chip;

a metal plate having said semiconductor chip die-bonded to a top face thereof;

a plastic package in the shape of a rectangular parallelepiped having said semiconductor chip and said metal plate molded therein, said metal plate having an exposed back face and not protruding from the periphery of said plastic package;

outer leads protruding outwardly from four side faces of said plastic package and electrically connected to a signal electrode of said semiconductor chip; and a solder portion which is soldered to the ground pattern of said printed circuit board, said solder portion formed by cutting away at least one corner of said plastic package to expose a portion of the top face of said metal plate.

3. An RF-driven semiconductor device mounted on a printed circuit board having a ground pattern, comprising;

an RF-driven semiconductor chip:

a metal plate having said semiconductor chip die-bonded to a top face thereof;

a plastic package in the shape of a rectangular parallelepiped having said semiconductor chip and said metal plate molded therein, said metal plate having an exposed back face and not protruding from the periphery of said plastic package;

outer leads protruding outwardly from four side faces of said plastic package and electrically connected to a signal electrode of said semiconductor chip; and solder portions which are soldered to the ground pattern of said printed circuit board, said solder portions formed by cutting away four corners of said plastic package to expose portions of the top face of said metal plate.

* * * * *